(12) United States Patent
Park et al.

(10) Patent No.: US 6,646,492 B2
(45) Date of Patent: Nov. 11, 2003

(54) COMPLEMENTARY PASS TRANSISTOR BASED FLIP-FLOP

(75) Inventors: Ki-tae Park, Yongin (KR); Hyo-sik Won, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/396,628

(22) Filed: Mar. 25, 2003

(65) Prior Publication Data

US 2003/0141913 A1 Jul. 31, 2003

Related U.S. Application Data

(62) Division of application No. 10/001,450, filed on Oct. 22, 2001, now Pat. No. 6,566,927.

(30) Foreign Application Priority Data

Oct. 23, 2000 (KR) .......................................... 2000-62259
May 29, 2001 (KR) .......................................... 2001-29730

(51) Int. Cl.[7] ................................................. H02J 3/38
(52) U.S. Cl. ....................... 327/530; 327/211; 327/212; 327/218
(58) Field of Search ................................ 327/530, 537, 327/538, 540, 541, 211, 212, 217, 218, 223, 225, 581, 199–203, 207–210; 326/20, 24, 80–83, 93–95, 112, 113

(56) References Cited

U.S. PATENT DOCUMENTS

| | | | | |
|---|---|---|---|---|
| 5,189,315 A | * | 2/1993 | Akata | 327/203 |
| 5,257,223 A | * | 10/1993 | Dervisoglu | 365/154 |
| 5,486,774 A | * | 1/1996 | Douseki et al. | 326/33 |
| 5,583,457 A | * | 12/1996 | Horiguchi et al. | 326/121 |
| 5,973,552 A | * | 10/1999 | Allan | 327/544 |
| 6,111,427 A | * | 8/2000 | Fujii et al. | 326/34 |
| 6,242,958 B1 | * | 6/2001 | Fletcher | 327/202 |
| 6,366,147 B2 | * | 4/2002 | Sachdev et al. | 327/211 |
| 6,404,254 B2 | * | 6/2002 | Iwaki et al. | 327/214 |
| 6,445,217 B1 | * | 9/2002 | Kojima et al. | 327/57 |
| 6,462,582 B1 | * | 10/2002 | Forbes | 326/98 |
| 6,501,315 B1 | * | 12/2002 | Nguyen | 327/211 |
| 6,566,927 B2 | * | 5/2003 | Park et al. | 327/211 |

* cited by examiner

*Primary Examiner*—Timothy P. Callahan
*Assistant Examiner*—Hai L. Nguyen
(74) *Attorney, Agent, or Firm*—Mills & Onello LLP

(57) ABSTRACT

A complementary pass transistor based flip-flop (CP flip-flop) having a relatively small layout area and operable at a high speed with reduced power consumption is provided. The CP flip-flop does not need an additional circuit for retaining latched data in a sleep mode. The CP flip-flop receives a clock signal, delays the clock signal for a predetermined time period, and detects the delay time period from the clock signal. The CP flip-flop receives input data for the predetermined delay time and latches the input data until new input data is received. The CP flip-flop is advantageous in that the design of timing for retaining data can be simplified.

26 Claims, 17 Drawing Sheets

US 6,646,492 B2

COMPLEMENTARY PASS TRANSISTOR BASED FLIP-FLOP

RELATED APPLICATIONS

This application is a divisional of U.S. application Ser. No. 10/001,450, filed on Oct. 22, 2001, now U.S. Pat. No. 6,566,927 the contents of which are incorporated herein in their entirety by reference.

BACKGROUND OF THE INVENTION

1. Field of the Invention

The present invention relates to flip-flops, and more particularly, to a complementary pass transistor based flip-flop (CP flip-flop) which is smaller than a conventional low-power flip-flop, and is operable at a high speed in an active mode with reduced power consumption and can latch data in a sleep mode with minimum power consumption.

2. Description of the Related Art

FIG. 1A is a circuit diagram of a conventional transmission gate master-slave flip-flop (TGFF). Referring to FIG. 1A, the FGFF consists of a master stage on the left of a dashed line and a slave stage on the right of the dashed line. When a clock signal Clk is high, the master stage receives and latches input data, and the slave stage latches and outputs the previous logic state. When the clock signal Clk is low, the master stage no longer receives the input data, and the slave stage receives and outputs the logic state passed from the master stage. In FIG. 1A, Vdd denotes a high supply voltage, GND denotes ground voltage, Clkb denotes an inverted clock signal, and Q denotes a positive output node.

FIG. 1B is a circuit diagram of a conventional hybrid latch flip-flop (HLFF). Referring to FIG. 1B, the HLFF consists of a dynamic front stage on the left of a dashed line and a static back stage on the right of the dashed line.

When a clock signal Clk goes from a high level to a low level, an inverted clock signal Clkb is delayed by three inverters. During the delay period, input data Data is passed to the front stage, and the front stage is charged or discharged, or remains at the previous logic state. The back stage remains at the previous logic state.

When the clock signal Clk goes from a low level to a high level, the front stage no longer receives the input data Data, and the back stage outputs the previous logic state.

FIG. 1C is a circuit diagram of a conventional semi-dynamic flip-flip (SDFF). Referring to FIG. 1C, the SDFF consists of a precharge stage on the left of a dashed line, and an output buffer stage on the right of the dashed line. When an input data Data is high, the precharge stage is fully discharged so that an output Q_b becomes high. When the input data Data is low, the precharge stage is charged to a logic high state, and the output Q_b becomes low.

FIG. 1D is a circuit diagram of a conventional sense amplifier flip-flop (SAFF). Referring to FIG. 1D, for the SAFF, when a clock is high, a voltage level of the input signal Data is stored in a latch circuit including two NAND gates and then is output. When the clock is low, outputs Q and Qb remain at the previous state regardless of the state of the input signal Data received.

In the conventional flip-flops described above, the master stage or the dynamic front stage needs to be precharged so that power consumption is considerable. Currently available systems need high-speed and low power consumption. However, use of the conventional flip-flops increases layout area and power consumption.

When a multi-threshold complementary metal oxide silicon (MTCMOS) technique is applied to the conventional flip-flops, the conventional flip-flops are available in the active and sleep modes of a system which includes a power-down circuit that suspends operation by cutting off the supply power. In this case, there is a need for a circuit for retaining latched data when the supply power is cut off. In addition, there is a drawback in that designing control signals for data storage is more complicate.

According to the MTCMOS technique, a MOS switch having a relatively high threshold voltage is serially connected between the power supply voltage Vdd, Vss, or GND and a logic circuit. Depending on whether the MOS switch is opened or closed, the power supply voltage is supplied to the logic circuit, which is formed by an NMOS transistor having a relatively low threshold voltage, or is cut off, thereby reducing power consumption. In particular, in the active mode, the MOS switch is turned on to supply the power supply voltage to the logic circuit. In the sleep mode, the MOS switch is turned off to stop the supply power being provided to the logic circuit, thereby minimizing power consumption of the overall system.

The MTCMOS technique is highly effective to reduce power consumption by circuits in a system in which the sleep mode is relatively longer than the active mode. However, if a special measure for the power cut-off period is not considered, data stored in a latch circuit or a flip-flop would be lost.

SUMMARY OF THE INVENTION

To solve the above-described problems, it is a first object of the present invention to provide a complementary pass transistor based flip-flop (CP flip-flop) which has a smaller layout area than a conventional low-power flip-flop and is operable at a high speed with reduced power consumption.

It is a second object of the present invention to provide a CP flip-flop in which data can be latched in the sleep mode without need for an additional circuit for retaining latched data, and power consumption is also minimized.

To achieve the first object of the present invention, there is provided a complementary pass transistor based flip-flop comprising: a clock delay unit for inverting and delaying a clock signal; a switch unit for switching input data in response to the clock signal and an output signal of the clock delay unit; and a latch unit for latching at least one output signal of the switch unit.

In a first embodiment of the CP flip-flop, the clock delay unit may include an odd number of inverters connected in series for inverting the clock signal. The switch unit may include a first switch for switching the input data in response to the clock signal, and a second switch for switching an output signal of the first switch in response to the output signal of the clock delay unit. The latch unit may include a first inverter having an input port connected to the second switch of the switch unit, and a second inverter having an input port connected to an output port of the first inverter and an output port connected to the input port of the first inverter.

In a second embodiment of the CP flip-flop, the CP flip-flop may further comprise a first inverter for inverting the input data. The clock delay unit may include an odd number of inverters connected in series for inverting and delaying the clock signal. The switch unit may comprise: a first switch for switching the input data in response to the clock signal; a second switch for switching an output signal of the first switch in response to the output signal of the clock delay unit; a third switch for switching an output signal of the first inverter in response to the clock signal; and a fourth switch for switching an output signal of the third switch in response to the output signal of the clock delay unit. The latch unit may comprise a second inverter having an input port connected to the second switch of the switch unit and an output port connected to the fourth switch; and a third inverter having an input port connected to the fourth switch of the switch unit and an output port connected to the second switch.

In a third embodiment of the CP flip-flop, the clock delay unit inverts and delays the clock signal in response to an enable signal. The switching unit may include a first switch for switching the input data in response to the clock signal and a second switch for switching an output signal of the first switch. The latch unit may include a logic circuit and a latch circuit. The logic circuit may include a NAND gate that responds to a set signal and a reset signal. The latch circuit may include first and second inverters for latching the input data and four NMOS transistors that respond to a set signal and a reset signal.

In a fourth embodiment of the CP flip-flop, the CP flip-flop may further include a first inverter for inverting the input data. The clock delay unit may invert and delay the clock signal in response to an enable signal. The switch unit may include: a first switch for switching the input data in response to the clock signal; a second switch for switching an output signal of the first switch in response to the output signal of the clock delay unit; a third switch for switching an output signal of the first inverter in response to the clock signal; and a fourth switch for switching an output signal of the third switch in response to the output signal of the clock delay unit. The latch unit may include a logic circuit and a latch circuit. The logic circuit may include a NAND gate that responds to a set signal and a reset signal. The latch circuit may include second and third inverters for latching the input data and four MOS transistors that respond to the set and reset signals.

To achieve the second object of the present invention, there is provided a CP flip-flop comprising first and second virtual power supply units, a clock delay unit, a switch unit, and a latch unit. The first virtual power supply unit provides a first virtual power supply voltage by receiving a first power supply voltage having a highest voltage level. The second virtual power supply unit provides a second virtual power supply voltage by receiving a second power supply voltage having a lowest voltage level. The clock delay unit receives and outputs a clock signal by inverting and delaying the clock signal, and further receives at least one control signal and outputs the clock signal by inverting and delaying the clock signal in response to the control signal. The switch unit switches input data in response to the clock signal and an output signal of the clock delay unit. The latch unit latches at least one output signal of the switch unit.

Both the clock delay unit and the switch unit comprise low-threshold MOS transistors, the latch unit comprises a plurality of low-threshold MOS transistors or comprises a plurality of low-threshold MOS transistors and at least one high-threshold MOS transistor. The plurality of low-threshold MOS transistors are operated between the first power supply voltage and the second power supply voltage, between the first power supply voltage and the second virtual power supply voltage, between the first virtual power supply voltage and the second power supply voltage, or between the first virtual power supply voltage and the second virtual power supply voltage, and the high-threshold MOS transistor is operated between the first power supply voltage and the second power supply voltage. Each of the plurality of low-threshold MOS transistors has a lower threshold voltage than the high-threshold MOS transistor. For example, each of the plurality of low-threshold MOS transistors has a threshold voltage of 0.1–0.4 volts for NMOS transistors and −0.1−−0.4 volts for PMOS transistors, and the high-threshold MOS transistor has a threshold voltage of 0.4–0.7 volts for NMOS transistors and −0.4−−0.7 volts for PMOS transistors.

Preferably, each of the plurality of low-threshold MOS transistors has a threshold voltage of 0.33±0.04 volts for NMOS transistors and −0.40±0.04 volts for PMOS transistors, and the high-threshold MOS transistor has a threshold voltage of 0.6±0.06 volts for NMOS transistors and −0.65±0.06 volts for PMOS transistors.

In a fifth embodiment of the CP flip-flop according to the present invention, the clock delay unit may include an odd number of inverters connected in series and each including a low-threshold MOS transistor. The switch unit may comprise: a first switch including at least one low-threshold MOS transistor for switching the input data in response to the clock signal; and a second switch including at least one low-threshold MOS transistor for switching an output signal of the first switch in response to the output signal of the clock delay unit. The latch unit may comprise: a first inverter including high-threshold MOS transistors and having an input port connected to an output port of the second switch; and a second inverter including high-threshold MOS transistors and having an input port connected to an output port of the first inverter and an output port connected to the input port of the first inverter. The latch unit may further comprise a first low-threshold PMOS transistor having one end connected to the first supply power voltage, the other end connected to the input port of the first inverter, and a gate connected to the output port of the first inverter.

In the fifth embodiment and following sixth through tenth embodiments, it is preferable that the low-threshold MOS transistors are operated between the first virtual power supply voltage and the second virtual power supply, and the high-threshold MOS transistor is operated between the first power supply voltage and the second power supply voltage.

In a sixth embodiment of the CP flip-flop according to the present invention, the clock delay unit may include a third inverter for inverting the clock signal, a fourth inverter for inverting an output signal of the third inverter, and a NOR gate for inverting the clock signal and outputting an inverted clock signal in response to an output signal of the fourth inverter and an anti-floating signal. The third and fourth inverters include low-threshold MOS transistors, and the NOR gate includes low-threshold and high-threshold MOS transistors. The same switch unit and latch unit as in the fifth embodiment are applied. The anti-floating signal prevents occurrence of leakage current by turning off the NMOS transistors 1122 and 1124 of FIGS. 11 through 14 when the power is turned off.

In a seventh embodiment of the present invention, the CP flip-flop may further include a third inverter for inverting the input data. The clock delay unit may include an odd number of inverters each having low-threshold MOS transistors. The switch unit may include a first switch for switching the input data in response to the clock signal, a second switch for switching an output signal of the first switch in response to the output signal of the clock delay unit, a third switch for switching an output signal of the third inverter, which is an inverted version of the input data, in response to the clock signal, and a fourth switch for switching an output signal of the fourth switch. Each of the first through fourth switches includes at least one low-threshold MOS transistor.

In this case, the latch unit may include: a first inverter having an input port to which an output signal of the second switch is applied and an output port connected to an output port of the fourth switch; and a second inverter having an input port to which an output signal of the fourth switch is applied and an output port connected to an output port of the second switch. Each of the first and second inverters may include high-threshold MOS transistors.

The latch unit may further comprise a first low-threshold PMOS transistor having one end connected to the first supply power voltage, the other end connected to the output port of the second switch, and a gate connected to an output port of the fourth switch, and/or a second low-threshold PMOS transistor having one end connected to the first supply power voltage, the other end connected to the output port of the fourth switch, and a gate connected to the output port of the second inverter.

In an eighth embodiment of the CP flip-flop according to the present invention, the clock delay unit may include a fourth inverter for inverting the clock signal, a fifth inverter for inverting an output signal of the fourth inverter, and a NOR gate for inverting and delaying the clock signal and outputting an inverted clock signal in response to an output signal of the fifth inverter and an anti-floating signal. The fourth and fifth inverters include low-threshold MOS transistors. The NOR gate includes low-threshold MOS transistors and high-threshold MOS transistors. The same switch unit and latch unit as in the seventh embodiment are applied.

In a ninth embodiment of the CP flip-flop according to the present invention, the CP flip-flop may further comprise a data holding unit. The data holding unit may include: a first high-threshold NMOS transistor having one end connected to an output port of the second switch and a gate to which the data hold signal is applied; a second high-threshold NMOS transistor having one end connected to an output port of the fourth switch and a gate to which the data hold signal is applied; a second inverter having an input port connected to the other end of the first high-threshold NMOS transistor and an output port connected to the other end of the second high-threshold NMOS transistor; and a third inverter having an input port connected to the other end of the second high-threshold NMOS transistor and an output port connected to the other end of the first high-threshold NMOS transistor.

In this case, the latch unit may include: a first inverter having an input port connected to an output port of the second switch and an output port connected to an output port of the fourth switch; and a second inverter having an input port connected to an output port of the fourth switch and an output port connected to the output port of the second switch. Each of the first and second inverters may include high-threshold MOS transistors.

The latch unit may further comprise a first low-threshold PMOS transistor having one end connected to the first supply power voltage, the other end connected to the output port of the second switch, and a gate connected to the output port of the fourth switch, and/or a second low-threshold PMOS transistor having one end connected to the first supply power voltage, the other end connected to the output port of the fourth switch, and a gate connected to the output port of the second inverter. The third inverter for inverting the data signal and the switch unit, which are the same as those of the seventh embodiment, are applied.

In a tenth embodiment of the present invention, the CP flip-flop may further comprise a reset unit. The reset unit may comprise: a first NAND gate that responds to set and reset signals; a first high-threshold NMOS transistor having one end connected to the output port of the second switch and a gate to which the reset signal is applied; a second high-threshold NMOS transistor having one end connected to the output port of the fourth switch, the other end connected to the other end of the first high-threshold NMOS transistor, and a gate to which the set signal is applied; and a third high-threshold NMOS transistor having one end connected to the second power supply voltage, the other end connected to the other ends of the first and second high-threshold NMOS transistors, and a gate to which an output signal of the first NAND gate is applied. The first NAND gate may include a first low-threshold MOS transistor.

In this case, the clock delay unit may include a fourth inverter for inverting the clock signal, a second NAND gate that responds to an output signal of the fourth inverter and an enable signal, and a NOR gate that responds to an output signal of the second NAND gate and the anti-floating signal. The switch unit, the latch unit, and the third inverter, which are the same as in the seventh embodiment, are applied.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS OF THE INVENTION

Figure 1A:
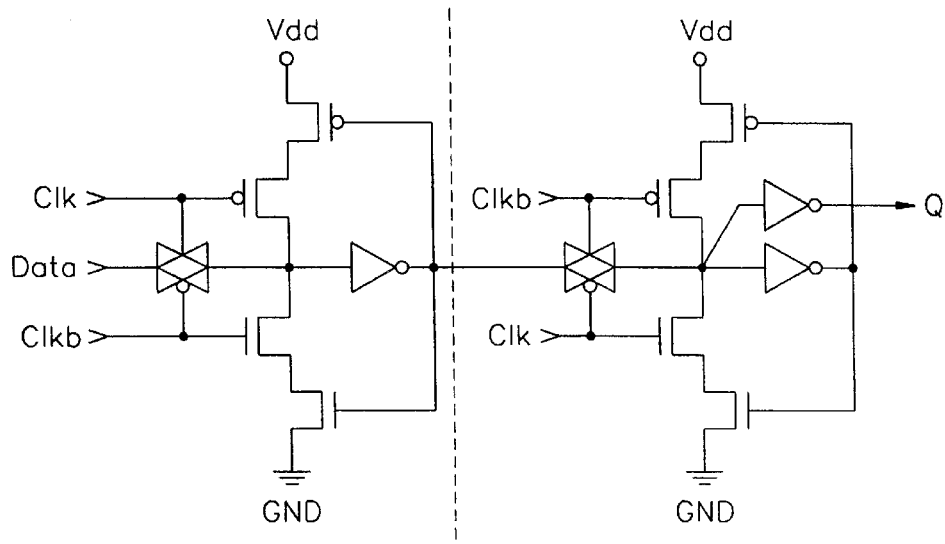
FIG. 1A is a circuit diagram of a conventional transmission gate master-slave flip-flop.
Figure 1B:
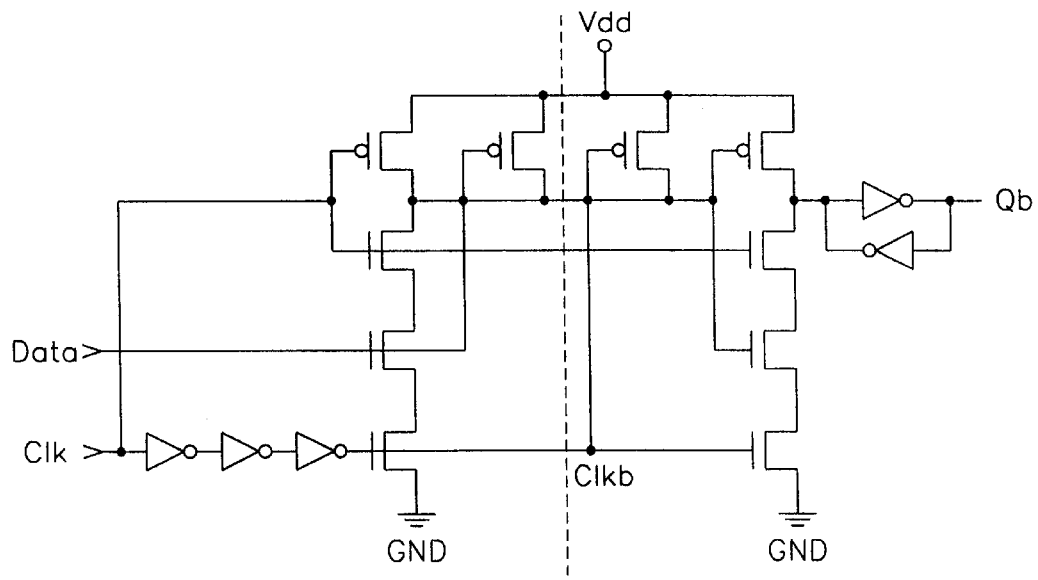
FIG. 1B is a circuit diagram of a conventional hybrid latch flip-flop.
Figure 1C:
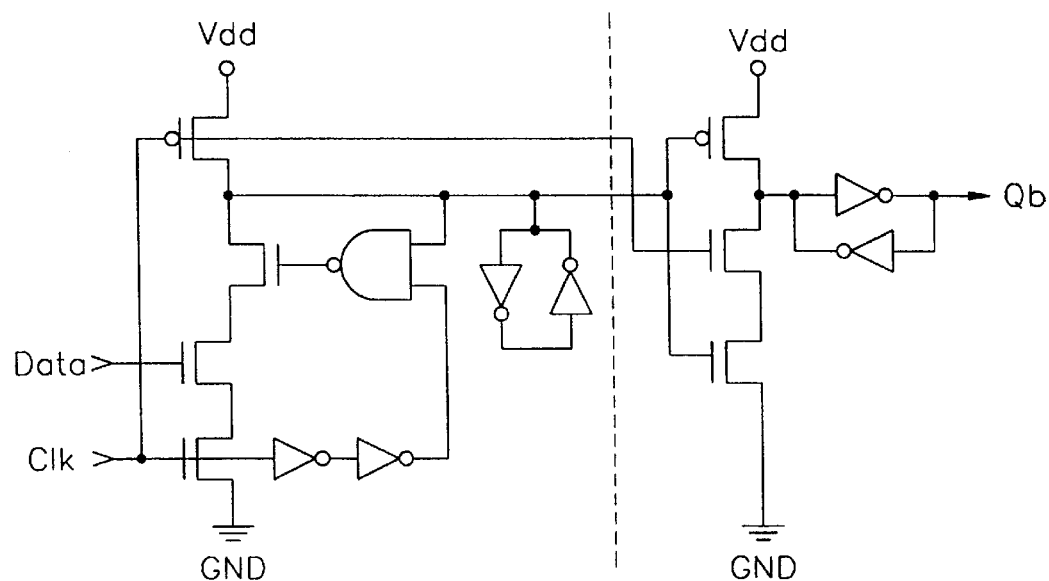
FIG. 1C is a circuit diagram of a conventional semi-dynamic flip-flop.
Figure 1D:
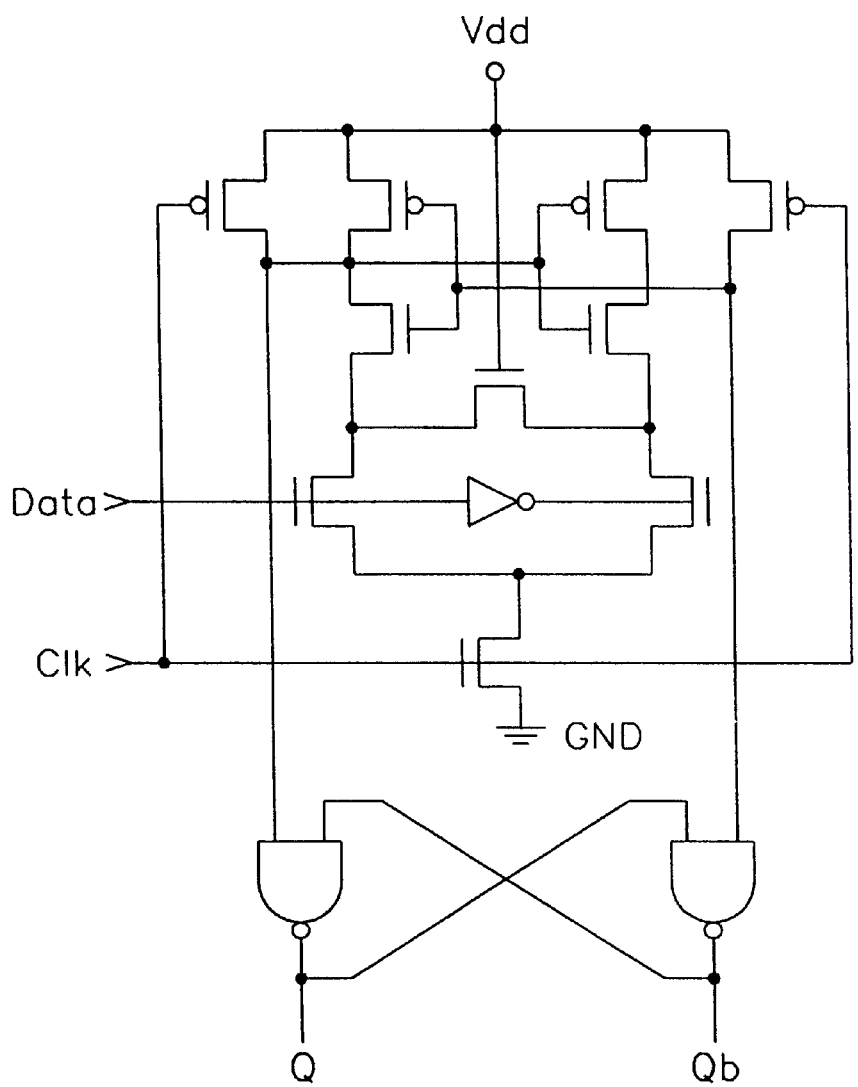
FIG. 1D is a circuit diagram of a conventional sense amplifier flip-flop.
Figure 2:
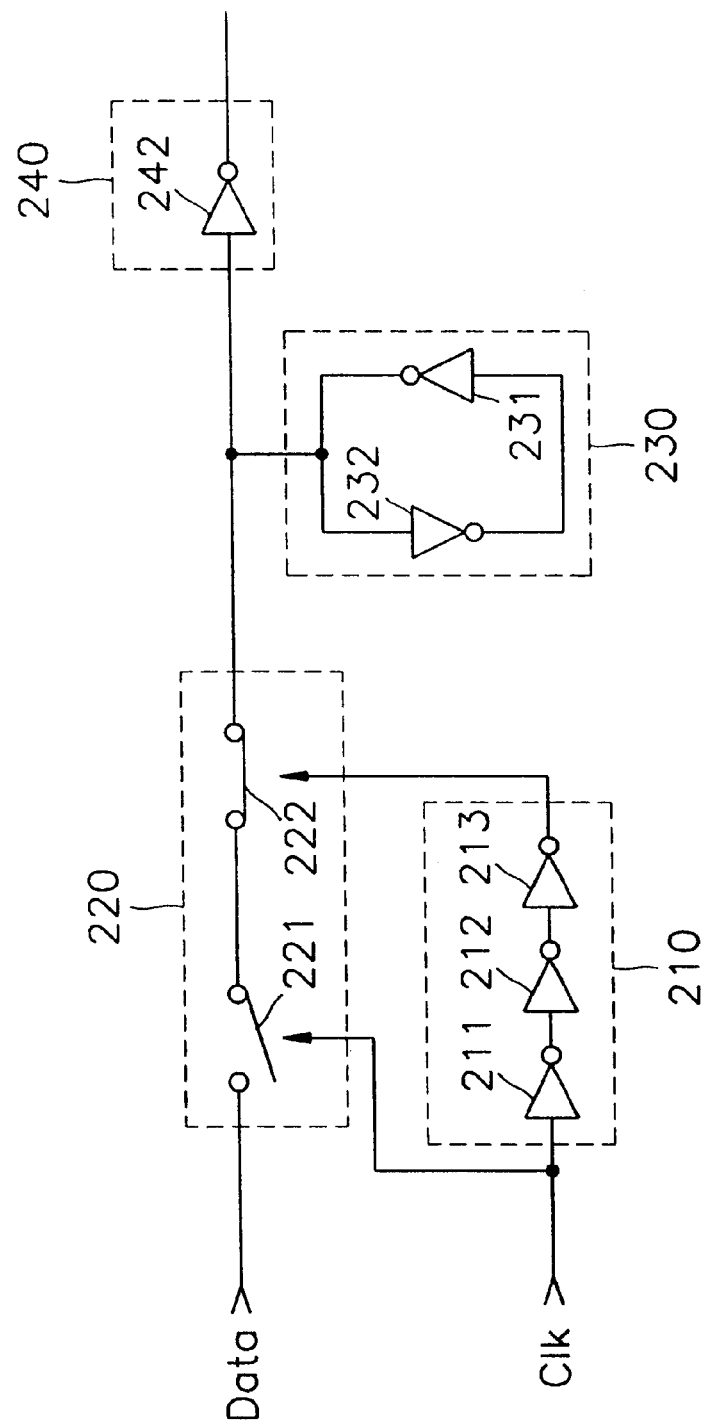
FIG. 2 is a circuit diagram of a first embodiment of a complementary pass transistor based flip-flop (CP flip-flop) according to the present invention.

FIG. 2 is a circuit diagram of a first embodiment of a complementary pass transistor based flip-flop (CP flip-flop) according to the present invention. Referring to FIG. 2, the CP flip-flop includes a clock delay unit 210, a switch unit 220, a latch unit 230, and a buffer unit 240.

The clock delay unit 210 includes a first inverter 211 for inverting a clock signal Clk, a second inverter 212 for inverting an output signal of the first inverter 211, and a third inverter 213 for inverting an output signal of the second inverter 212.

The switch unit 220 includes a first switch 221 for switching input data Data in response to the clock signal Clk, and a second switch 222 for switching an output signal of the first switch 221 in response to an output signal of the clock delay unit 210.

The latch unit 230 includes a fourth inverter 231 having an output port connected to the second switch 222, and a fifth inverter 232 having an input port connected to an output port of the fourth inverter 213 and an output port connected to the input port of the fourth inverter 231. The buffer unit 240 includes a sixth inverter 242.

Figure 3:
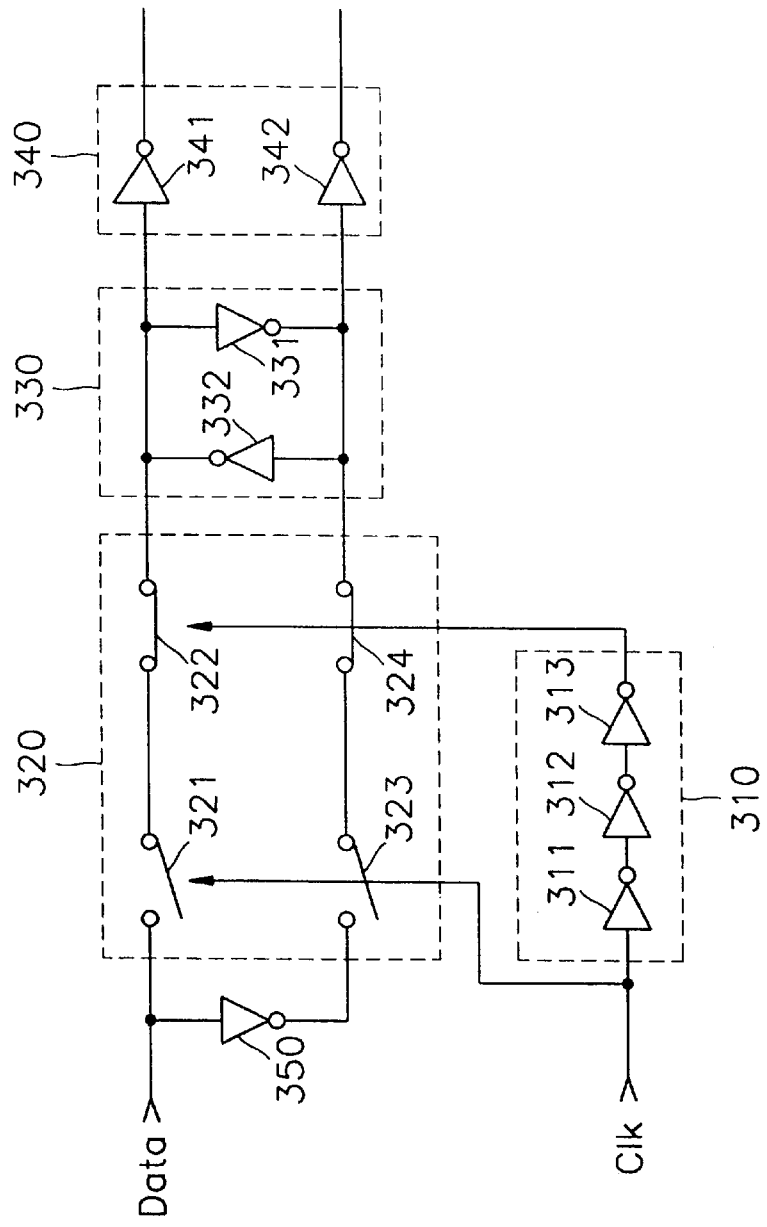
FIG. 3 is a circuit diagram of a second embodiment of the CP flip-flop according to the present invention.

FIG. 3 is a circuit diagram of a second embodiment of the CP flip-flip according to the present invention. Referring to FIG. 3, the CP flip-flop includes a clock delay unit 310, a switch unit 320, a latch unit 330, a buffer unit 340, and a first inverter 350.

The first inverter 350 inverts input data Data.

The clock delay unit 310 includes a second inverter 311 for inverting a clock signal Clk, a third inverter 312 for inverting an output signal of the second inverter 311, and a fourth inverter 313 for inverting an output signal of the third inverter 312.

The switch unit 320 includes a first switch 321 for switching the input data Data in response to the clock signal Clk, a second switch 322 for switching an output signal of the first switch 321 in response to an output signal of the clock delay unit 310, a third switch 323 for switching an output signal of the first inverter 350 in response to the clock signal Clk, and a fourth switch 324 for switching an output signal of the third switch 323 in response to the output signal of the clock delay unit 310.

The latch unit 330 includes a fifth inverter 331 having an input port connected to the second switch 322 of the switch unit 320 and an output port connected to the fourth switch 324 of the switch unit 320, and a sixth inverter 332 having an input port connected to the fourth switch 324 of the switch unit 320 and an output port connected to the second switch 322 of the switch unit 322.

The buffer unit 340 includes a seventh inverter 342 having an input port connected to the second switch 322 of the switch unit 320 and an eighth inverter 342 having an input port connected to the fourth switch 324 of the switch unit 320.

The operation of the CP flip-flops according to the first and second embodiments of the present invention will be described with reference to FIGS. 2 and 3.

When the clock signal Clk is low, the first switch 221 of the switch unit 220, and the first and third switches 321 and 323 of the switch unit 320 are opened ("Off") that the input signal Data cannot be received. The second switch 222 connected to the first switch 221, and the second and fourth switches 322 and 324 connected to the first and third switches 321 and 323, respectively, are closed ("On"). When the clock signal Clk is high, the first switch 221, and the first and third switches 321 and 323 are closed so that the input signal Data can be received. The second switch 222, and the second and fourth switches 322 and 324, which operate in response to the output signal of the respective clock delay units 210 and 310 for inverting and delaying the clock signal Clk, are opened after a predetermined period from the transition of the clock signal Clk from low to high.

When the clock signal Clk goes from low, at which the input signal Data is not allowed to input, to high, all the switches of the respective switch units 220 and 320 are closed for a clock delay time by the respective clock delay units 210 and 310. As a result, the input signal Data is passed through the CP flip-flops to determine the logic states of the respective latch units 230 and 330 and the output signals of the respective buffer units 240 and 340.

When a predetermined delay time has passed from the transition of the clock signal Clk from low to high, the output signals of the clock delay units 210 and 310 turn off the respective switches 222, 322, and 324 so that the latch units 230 and 330 or the buffer units 240 and 340 are not affected by the input signal Data. The output signals of the buffer units 240 and 340 are determined by logic values stored in the latch units 230 and 330, respectively.

When the clock signal Clk goes from high to low, the input signal Data is no longer received and thus the output states of the buffer units 240 and 340 do not change.

Figure 4:
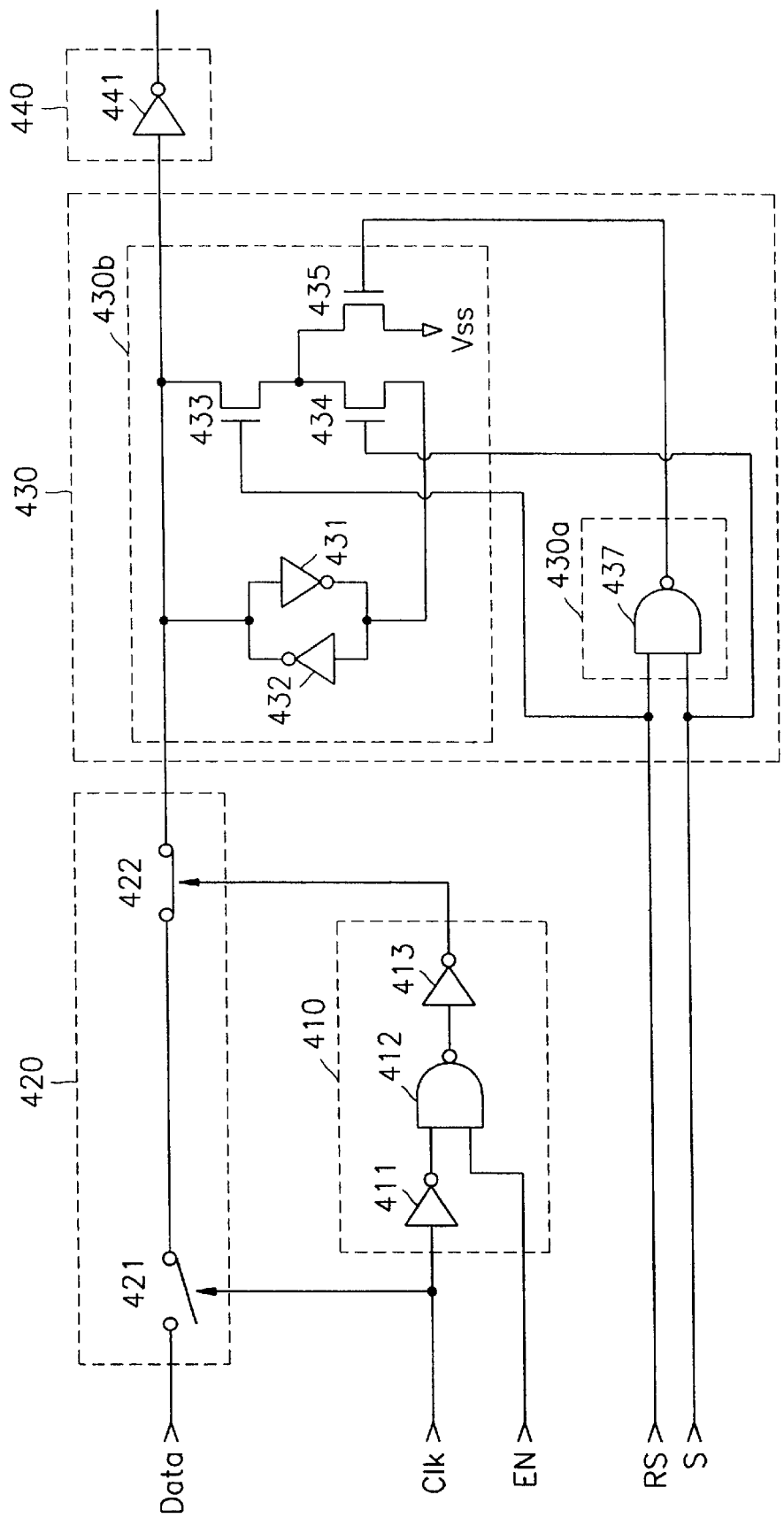
FIG. 4 is a circuit diagram of a third embodiment of the CP flip-flop according to the present invention.

FIG. 4 is a circuit diagram of a third embodiment of the CP flip-flop according to the present invention. Referring to FIG. 4, the CP flip-flop includes a clock delay unit 410, a switch unit 420, a latch unit 430, and a buffer unit 440.

The clock delay unit 410 includes a first inverter 411 for inverting a clock signal Clk, a first NAND gate 412 having one input port to which an output signal of the first inverter 411 is applied and the other input port to which an enable signal EN is applied, and a second inverter 413 for inverting an output signal of the first NAND gate 412.

The switch unit 420 includes a first switch 421 for switching input data Data in response to the clock signal Clk and a second switch 422 for switching an output signal of the first switch 421 in response to an output signal of the clock delay unit 410.

The latch unit 430 includes a logic circuit 430a and a latch circuit 430b. The logic circuit 430a includes a second NAND gate 437 that responses to a set signal S and a reset signal RS. The latch circuit 430b includes three NMOS transistors, i.e., a first MOS transistor 433, a second MOS transistor 434, and a third MOS transistor 435, a third inverter 431, and a fourth inverter 432. The third inverter 431 has an input port connected to an output port of the second switch 422 of the switch unit 420. The fourth inverter 432 has an input port connected to an output port of the third inverter 431 and an output port connected to the second switch 422 of the switch unit 420. The first MOS transistor 433 has one end connected to the output port of the second switch 422 of the switch unit 420 and a gate to which the reset signal RS is applied. The second MOS transistor 434 has one end connected to the other end of the first MOS transistor 433, the other end connected to the output port of the third inverter 431, and a gate to which the set signal S is applied. The third MOS transistor 435 has one end connected to the other end of the first MOS transistor 433 and the one end of the second MOS transistor 434, the other end connected to a power supply voltage Vss, and a gate to which an output signal of the second NAND gate 437 is applied. The buffer unit 433 includes a fifth inverter 441.

Figure 5:
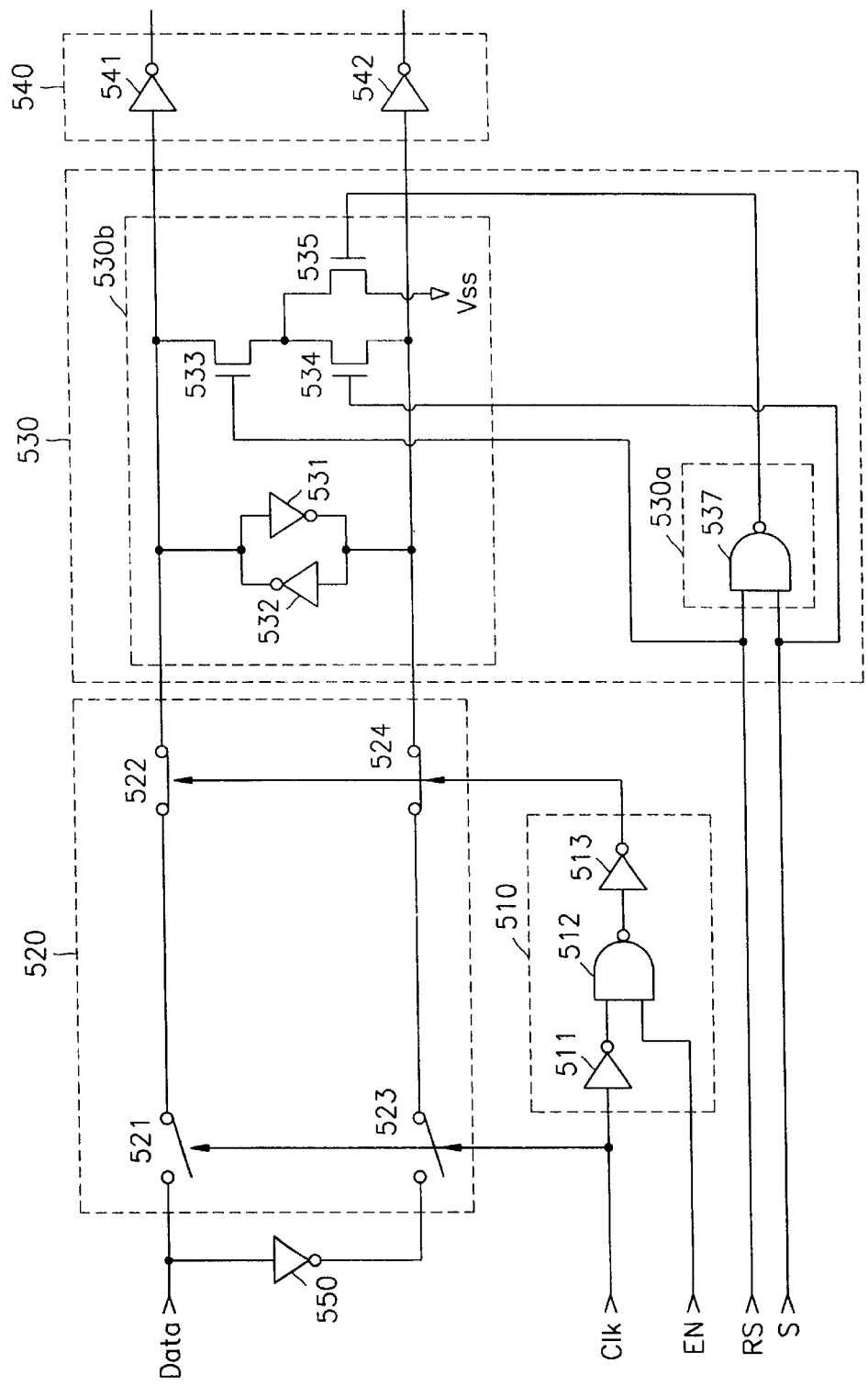
FIG. 5 is a circuit diagram of a fourth embodiment of the CP flip-flop according to the present invention.

FIG. 5 is a circuit diagram of a fourth embodiment of the CP flip-flop according to the present invention. Referring to FIG. 5, the CP flip-flop includes a clock delay unit 510, a switch unit 520, a latch unit 530, a buffer unit 540, and a first inverter 550.

The first inverter 550 inverts input data Data.

The clock delay unit 510 includes a second inverter 511 for inverting a clock signal Clk, a first NAND gate 512 having one input port to which an output signal of the second inverter 511 is applied and the other input port to which an enable signal EN is applied, and a third inverter 513 for inverting an output signal of the first NAND gate 512.

The switch unit 520 includes a first switch 521 for switching the input data Data in response to the clock signal Clk, a second switch 522 for switching an output signal of the first switch 521 in response to an output signal of the clock delay unit 510, a third switch 523 for switching an output signal of the first inverter 550 in response to the clock signal Clk, and a fourth switch 524 for switching an output signal of the third switch 523 in response to the output signal of the clock delay unit 510.

The latch unit 530 includes a logic circuit 530a and a latch circuit 530b. The logic circuit 530a includes a second NAND gate 537 that responses to a set signal S and a reset signal RS. The latch circuit 530b includes three NMOS transistors, i.e., a first MOS transistor 533, a second MOS transistor 534, and a third MOS transistor 535, a fourth inverter 531, and a fifth inverter 532. The fourth inverter 531 has an input port connected to an output port of the second switch 522 of the switch unit 520 and an output port connected to the fourth switch 524 of the switch unit 520. The fifth inverter 532 has an input port connected to the fourth switch 524 of the switch unit 520 and an output port connected to the second switch 522 of the switch unit 520. The first MOS transistor 533 has one end connected to the output port of the second switch 522 of the switch unit 520 and a gate to which the reset signal RS is applied. The second MOS transistor 534 has one end connected to the other end of the first MOS transistor 533, the other end connected to the output port of the fourth inverter 531, and a gate to which the set signal S is applied. The third MOS transistor 535 has one end connected to the other end of the first MOS transistor 533 and the one end of the second MOS transistor 534, the other end connected to a power supply voltage Vss, and a gate to which an output signal of the logic circuit 530a is applied.

The buffer unit 540 includes a sixth inverter 541 having an input port connected to the output port of the fifth inverter 532 of the latch unit 530 and a seventh inverter 542 having an input port connected to the output port of the fourth inverter 531.

The operation of the CP flip-flops according to the third and fourth embodiments of the present invention will be described with reference to FIGS. 4 and 5.

When the enable signal EN applied to the clock delay units 410 and 510 is logic high, the CP flip-flops normally operate. When the enable signal En is logic low, the output signals of the clock delay units 410 and 510 go to low, the second switch 422 of the switch unit 420, and the second and fourth switches 522 and 524 of the switch unit 520 are opened so that the input signal Data cannot be received.

When the set signal S and the reset signal are logic high, the CP flip-flops according to the present invention normally operate.

When the set signal S goes to low, the output signals of the logic circuits 430a and 530a of the latch units 430 and 530 become high, thereby turning on the third MOS transistors 435 and 535 of the latch circuits 430b and 530b. According to an operating logic, when the set signal S is low, the reset signal RS is forced high. Accordingly, the first MOS transistors 433 and 533 of the latch circuits 430b and 530b are turned on so that the output signals of the first inverter 441 and the sixth inverter 541 become high.

When the reset signal RS goes to low, the output signals of the logic circuits 430a and 530a of the latch units 430 and 530 become high, thereby turning on the third MOS transistors 435 and 535 of the latch circuits 430b and 530b. According to an operating logic, when the reset signal RS is low, the set signal S is forced high. Accordingly, the second MOS transistors 434 and 534 of the latch circuits 430b and 530b are turned on and the first MOS transistors 433 and 533 are turned off so that the output signals of the first inverter 411 and the sixth inverter 541 become low.

Here, the use of the second NAND gates 437 and 537 in the logic circuits 430a and 530a of the latch units 430 and 530, respectively, is considered for compensating for an unstable logic state which would occur when both the set signal S and the reset signal RS are high.

In the first through fourth embodiments of the CP flip-flop according to the present invention, the number of gates is reduced compared to existing flip-flops in use. This implies that the CP flip-flops according to the present invention reduce wafer occupancy. In addition, since signals can be passed within a very short period of time, the CP flip-flops are responsible to a considerably high frequency of system clock. Unlike the conventional flip-flops, there is no need to precharge the front stage of the CP flip-flops, thereby relatively reducing power consumption. The CP flop-flops according to the present invention represent a small load of the clock signal, and a total width of the gates of the transistors is smaller than that of the conventional flip-flops.

The CP flip-flops according to the present invention and the conventional flip-flops were compared through a simulation test under the same condition.

Figure 6:
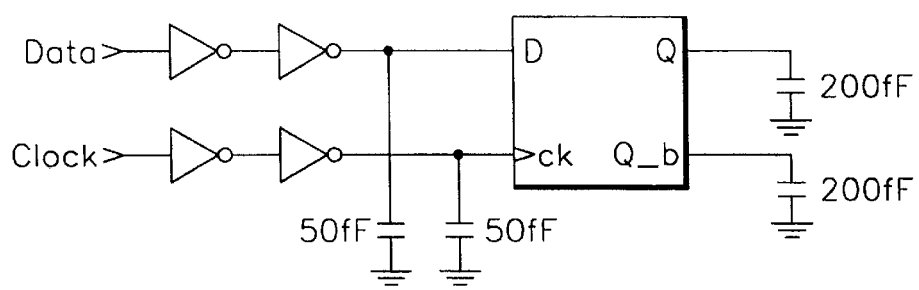
FIG. 6 is a circuit diagram of a test bench used for testing the flip-flops.

FIG. 6 is a circuit diagram of a test bench for testing the flip-flops. Referring to FIG. 6, it was assumed that the capacitive load of input data Data and a clock signal Clock is 50 femto Farad (fF), and that the capacitive load of the flip-flip at an output port Q and an inverted output port Q_b is 200 fF.

The main consideration in designing flip-flops is a trade-off between speed and power consumption. Thus, flip-flops are designed to have a minimal PDP (Power Delay Product).

For ease of comparison, maximum and minimum gate widths of transistors were 20 $\mu$m and 0.7 $\mu$m, respectively. Inverters serving as buffers, which include a PMOS transistor having a 35-$\mu$m gate width and an NMOS transistor having a 15-$\mu$m gate width, were used for the input data Data and the clock signal Clock.

In the circuit simulation test, a 0.35-$\mu$m standard CMOS process and a level 28 modified BSIM model as an MOS- FET model were applied. It was assumed that the clock frequency is 500 MHz and the input data sequence has 16 clock cycles.

Figure 7:
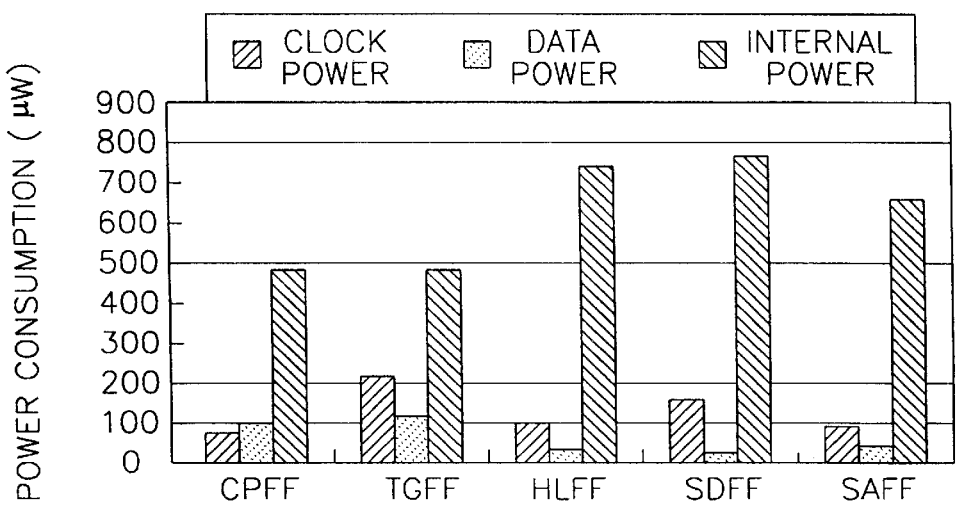
FIG. 7 is a graph of a result of the simulation test performed with the circuit of FIG. 6 for power consumption in the flip-flops.

FIG. 7 is a graph of a result of the simulation test for power consumption in the flip-flops. Referring to FIG. 7, power consumption by the clock signal and the data signal is not significantly different between the flip-flops, but internal power consumption is considerably different between the-flip-flops. For this measurement, input data having a sequence of "10101010 . . . " was used.

Figure 8:
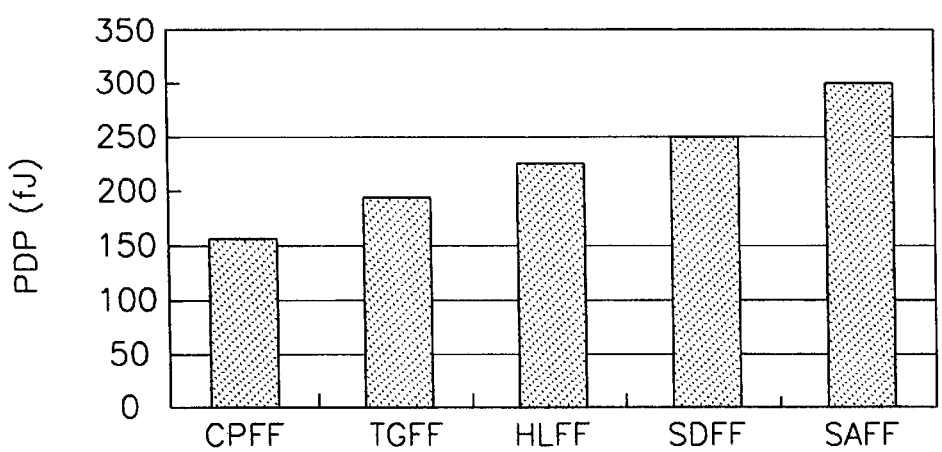
FIG. 8 is a graph of a result of the simulation of FIG. 6 for a PDP (Power Delay Product).

FIG. 8 is a graph of a result of the simulation test of FIG. 6 for the PDP. The PDP, which is the product of power consumption and delay in response, becomes greater in the order of CPFF, TGFF (transition gate master-slave flip-flop), HLFF (hybrid latch flip-flop), SDFF (semi-dynamic flip-flop), and SAFF (sense amplifier flip-flop). For this measurement, input data having a sequence of "11001100 . . . " was used.

Figure 9:
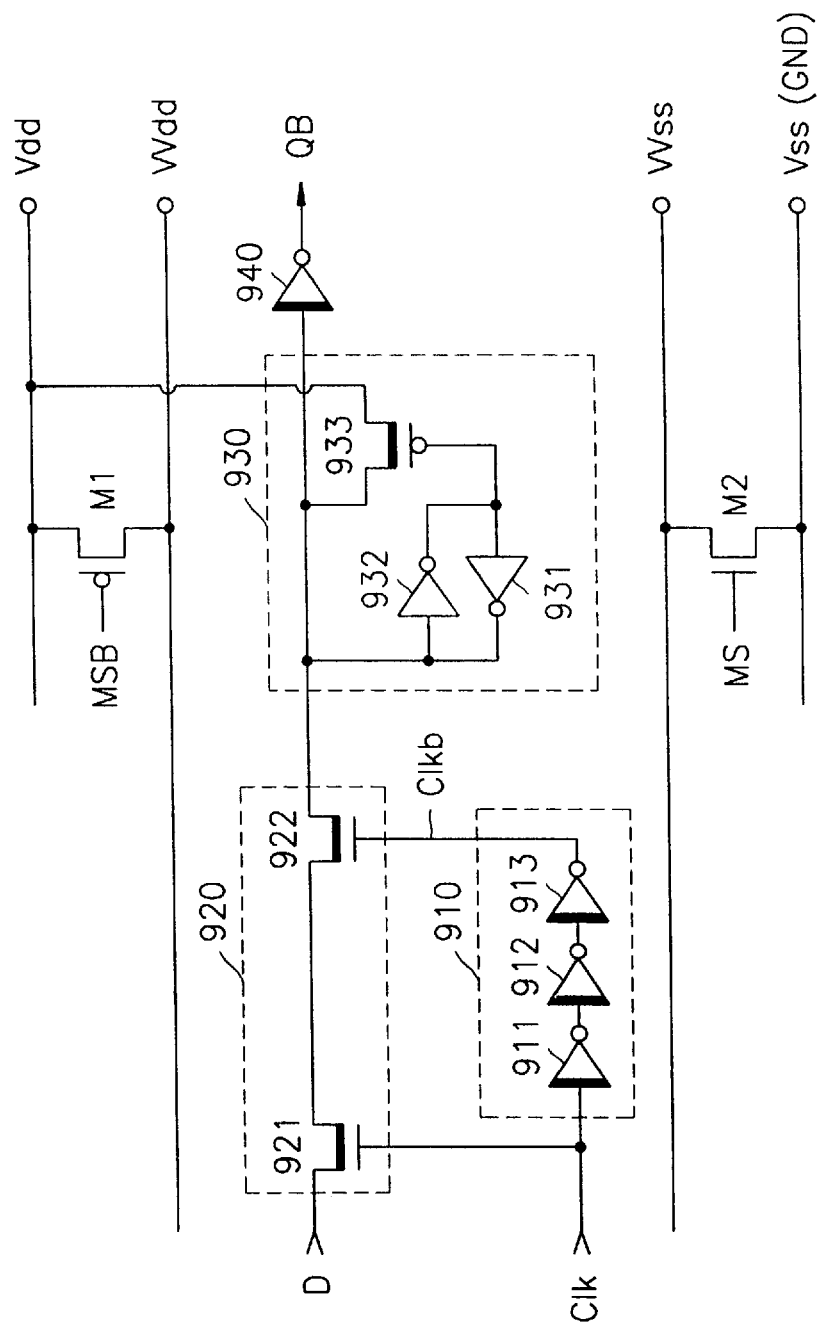
FIG. 9 is a circuit diagram of a fifth embodiment of the CP flip-flop according to the present invention.

FIG. 9 is a circuit diagram of a fifth embodiment of the CP flip-flop according to the present invention. Referring to FIG. 9, the CP flip-flip includes a clock delay unit 910, a switch unit 920, a latch unit 930, and a buffer unit 940.

A first virtual power supply voltage VVdd is a power supply node which responds to an inverted mode selection signal MBS and transfers a first power supply voltage Vdd to the flip-flop circuit using a switch M1 having a predetermined resistance in an ON-state ("ON-resistance"). A second virtual power supply voltage VVss or VGND is a power supply node which responds to a mode selection signal MS and transfers a second supply power voltage Vss to the flip-flop circuit using a switch M2 having a predetermined ON-resistance. Preferably, the switch M1 includes a high-threshold (HT) PMOS transistor and the switch M2 includes HT NMOS transistors.

The clock delay unit 910 includes three inverters 911, 912, and 913 and outputs an inverted clock signal Clkb. The three inverters 911, 912, and 913 include low-threshold (LT) MOS transistors. The switch unit 920 includes a first switch 921 for switching an input data D in response to a clock signal Clk and a second switch 922 for switching an output signal of the first switch 921 in response to the inverted clock signal Clkb. Each of the first and second switches 921 and 922 includes at least one LT MOS transistor.

The latch unit 930 includes a first inverter 932 for inverting an output signal of the second switch 922, a second inverter 931 for inverting an output signal of the first inverter 932 and feeding back the inverted output signal to an input port of the first inverter 932, and a first LT PMOS transistor 933 having one end connected to an output port of the second switch 922, the other end connected to the first power supply voltage Vdd, and a gate connected to an output port of the first inverter 932. The first and second inverters 932 and 931 include HT MOS transistors. The buffer unit 940 includes an inverter formed by an LT MOS transistor.

The clock delay unit 910 and the switch unit 920 comprise low-threshold MOS transistors. The latch unit 930 comprises a plurality of low-threshold MOS transistors or comprises a plurality of low-threshold MOS transistors and at least one high-threshold MOS transistor, the plurality of low-threshold MOS transistors each having a lower threshold voltage than the high-threshold MOS transistor and being operated between the first power supply voltage and the second power supply voltage, between the first power supply voltage and the second virtual power supply voltage, between the first virtual power supply voltage and the second power supply voltage, or between the first virtual power supply voltage and the second virtual power supply voltage, and the high-threshold MOS transistor being operated between the first power supply voltage and the second power supply voltage.

It is preferable that each of the plurality of low-threshold MOS transistors has a threshold voltage of 0.33±0.04 volts for NMOS transistors and −0.4±0.04 volts for PMOS transistors, and the high-threshold MOS transistor has a threshold voltage of 0.6±0.06 volts for NMOS transistors and −0.65±0.06 volts for PMOS transistors.

Figure 10:
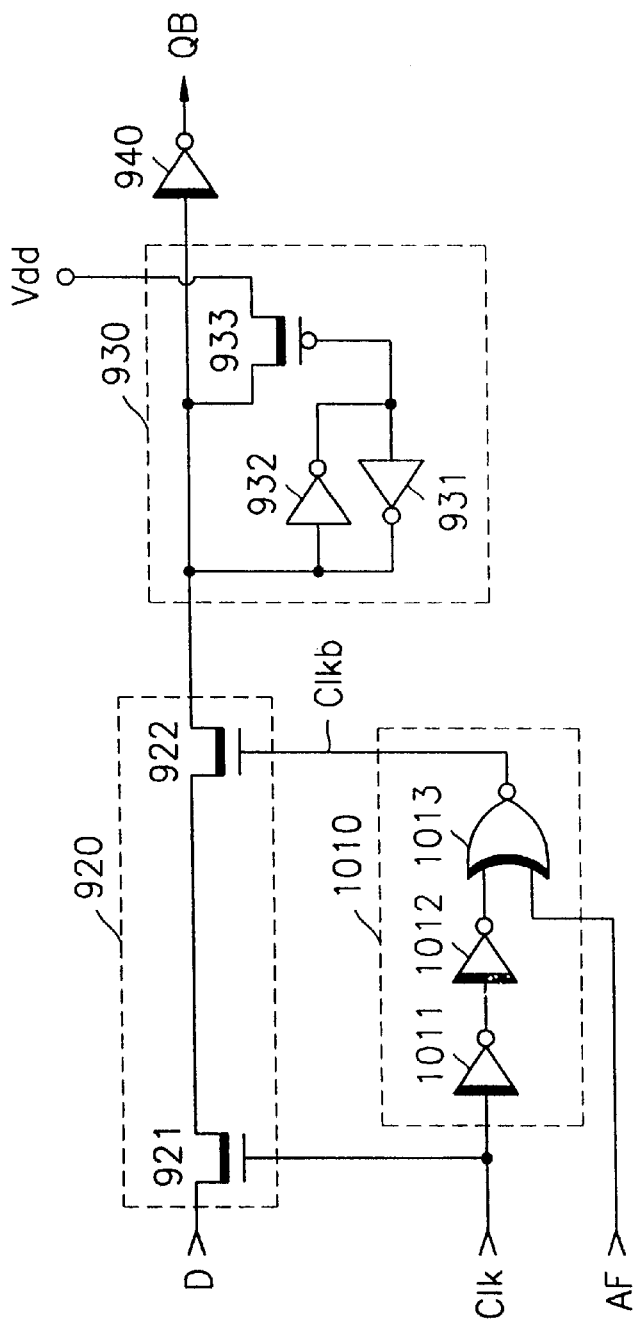
FIG. 10 is a circuit diagram of a sixth embodiment of the CP flip-flop according to the present invention.

FIG. 10 is a circuit diagram of a sixth embodiment of the CP flip-flop according to the present invention. Referring to FIG. 10, the CP flip-flop includes a clock delay unit 1010, a switch unit 920, a latch unit 930, and a buffer unit 940.

The CP flip-flop according to the sixth embodiment of the present invention differs from the fifth embodiment of the CP flip-flop only in the clock delay unit 1010. In particular, the clock delay unit 1010 includes a third inverter 1011 for inverting a clock signal Clk, a fourth inverter 1012 for inverting an output signal of the third inverter 1011, and a NOR gate 1013 which responses to an anti-floating signal AF provided to keep the state of data stored in a sleep mode and to an output signal of the second inverter 1012. The third inverter 1011 and the fourth inverter 1012 include LT MOS transistors, and the NOR gate 1013 includes an LT MOS transistor and a HT MOS transistor.

Figure 11:
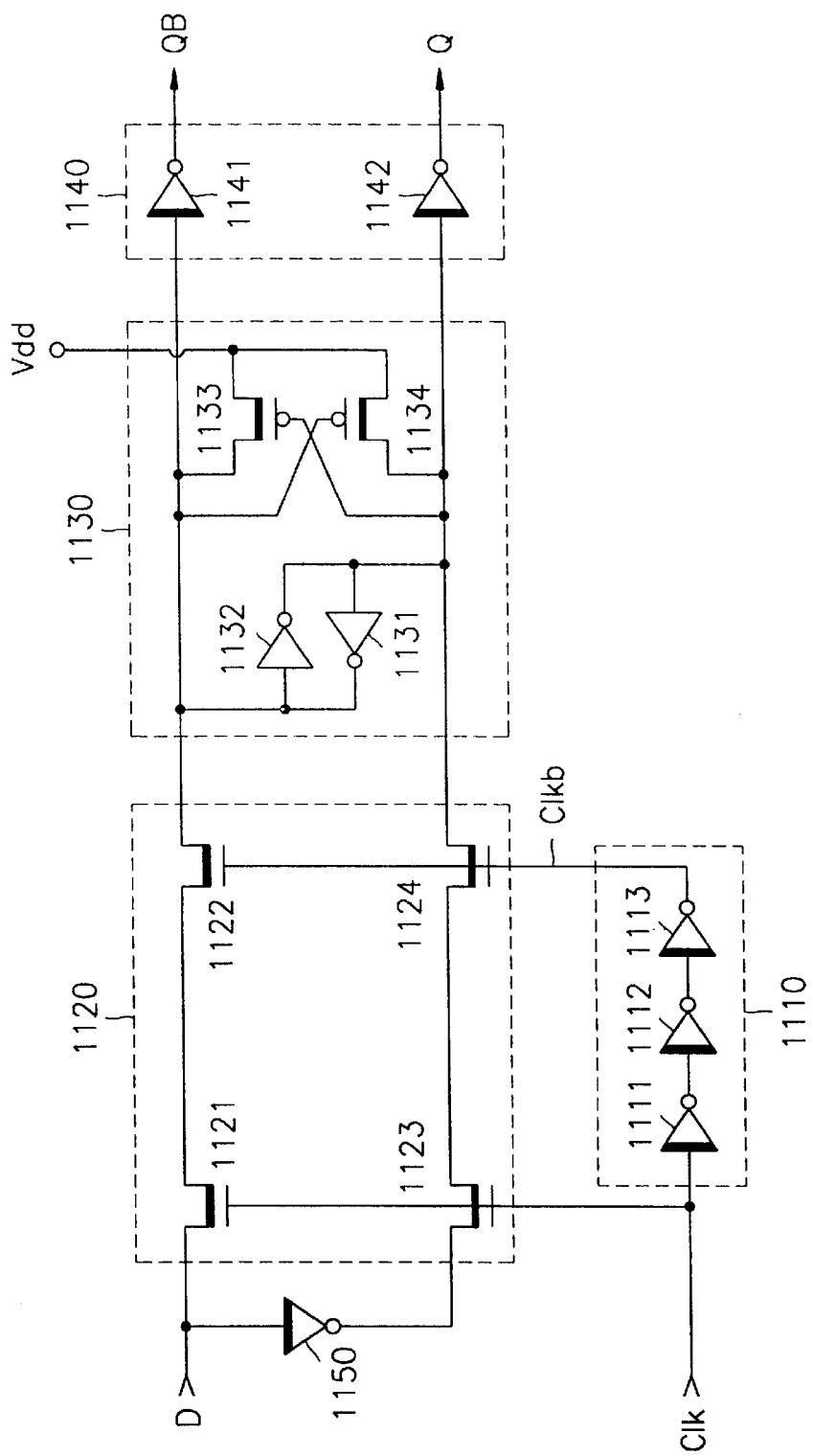
FIG. 11 is a circuit diagram of a seventh embodiment of the CP flip-flop according to the present invention.

FIG. 11 is a circuit diagram of a seventh embodiment of the CP flip-flop according to the present invention. Referring to FIG. 11, the CP flip-flop includes a clock delay unit 1110, a switch unit 1120, a latch unit 1130, a buffer unit 1140, and a third inverter 1150.

The clock delay unit 1110 includes three inverters 1111, 1112, and 1113 for inverting and delaying a clock signal Clk. The three inverters 1111, 1112, and 1113 include LT MOS transistors. The switch unit 1120 includes a first switch 1121, a second switch 1122, a third switch 1123, and a fourth switch 1124. The first switch 1121 switches an input data D in response to the clock signal Clk, and the second switch 1122 switches an output signal of the first switch 1121 in response to an inverted clock signal Clkb. The third switch 1123 switches an output signal of the third inverter 1123 in response to the clock signal Clk, and the fourth switch 1124 switches an output signal of the third switch 1123 in response to the inverted clock signal Clkb. Each of the first through fourth switches 1121 through 1124 includes at least one LT MOS transistor.

The latch unit 1130 includes a first inverter 1132 for inverting an output signal of the second switch 1122, a second inverter 1131 for inverting an output signal of the first inverter 1132 and feeding back the inverted output signal to an input port of the first inverter 1132, a first LT PMOS transistor 1133, and a second LT PMOS transistor 1134. The first LT PMOS transistor 1133 has one end connected to an output port of the second switch 1122, the other end connected to a first power supply voltage Vdd, and a gate connected to an output port of the first inverter 1132. The second LT PMOS transistor 1134 has one end connected to an output port of the fourth switch 1124, the other end connected to the first power supply voltage Vdd, and a gate connected to an outport of the second inverter 1131. The first inverter 1132 and the second inverter 1131 include HT MOS transistors.

The buffer unit 1140 includes a fourth inverter having an input port connected to the output port of the second switch 1122 and a fifth inverter 1142 having an input port connected to the output port of the fourth switch 1124. The third inverter 1150 inverts an input data D, and includes LT MOS transistors.

Figure 12:
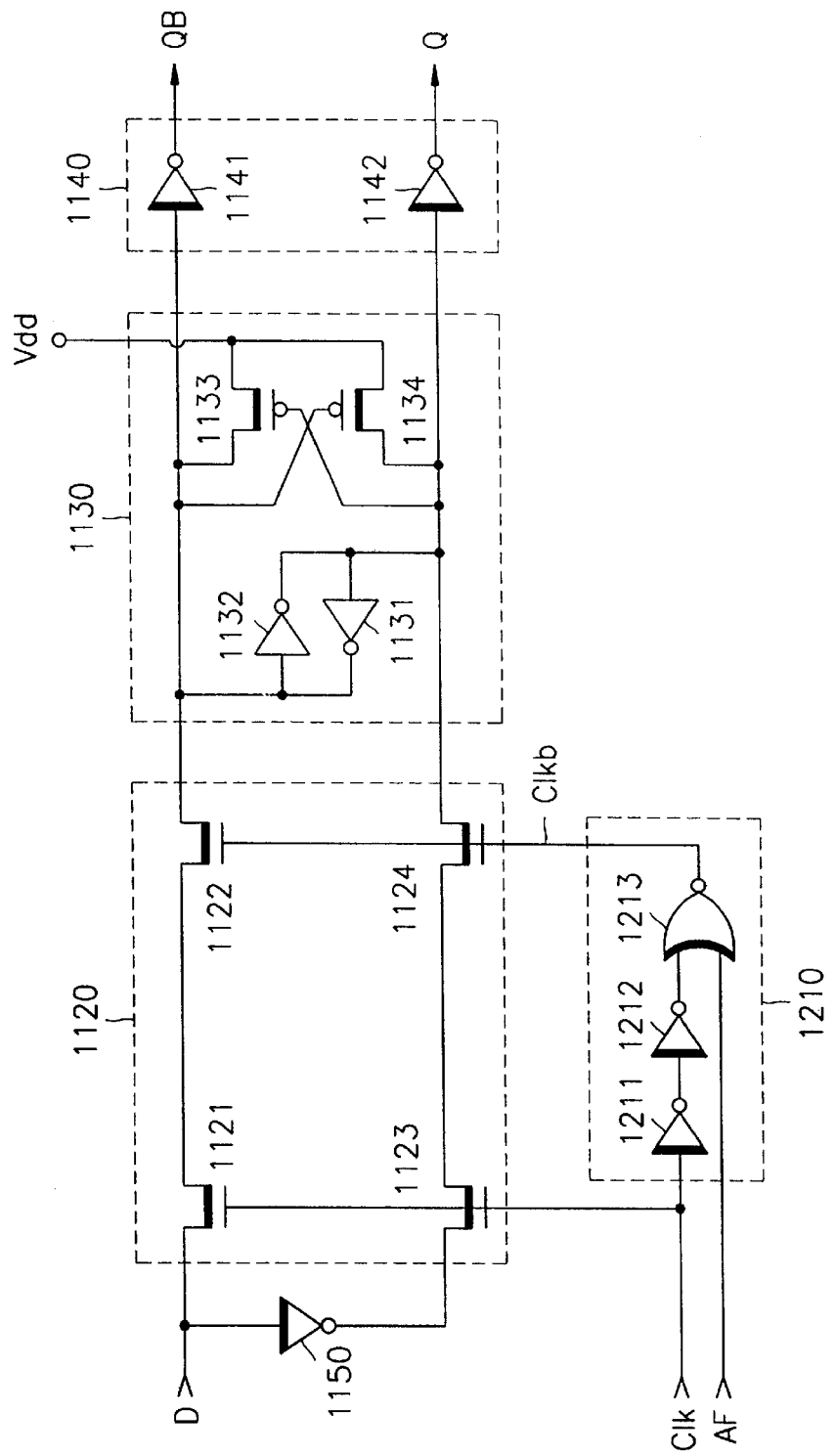
FIG. 12 is a circuit diagram of an eighth embodiment of the CP flip-flop according to the present invention.

FIG. 12 is a circuit diagram of an eighth embodiment of the CP flip-flop according to the present invention. Referring to FIG. 12, the CP flip-flop includes a clock delay unit 1210, a switch unit 1120, a latch unit 1130, a buffer unit 1140, and a third inverter 1150.

The CP flip-flop according to the eighth embodiment of the present invention differs from the seventh embodiment of the CP flip-flop according to the present invention only in the clock delay unit 1210. In particular, the clock delay unit 1210 includes a fourth inverter 1211 for inverting a clock signal Clk, a fifth inverter 1212 for inverting an output signal of the fourth inverter 1211, and a NOR gate 1213 which responds to an anti-floating signal AF and an output signal of the fifth inverter 1212. The fourth inverter 1211 and the fifth inverter 1212 include LT MOS transistors, and the NOR gate 1213 includes LT MOS transistors and HT MOS transistors.

Figure 13:
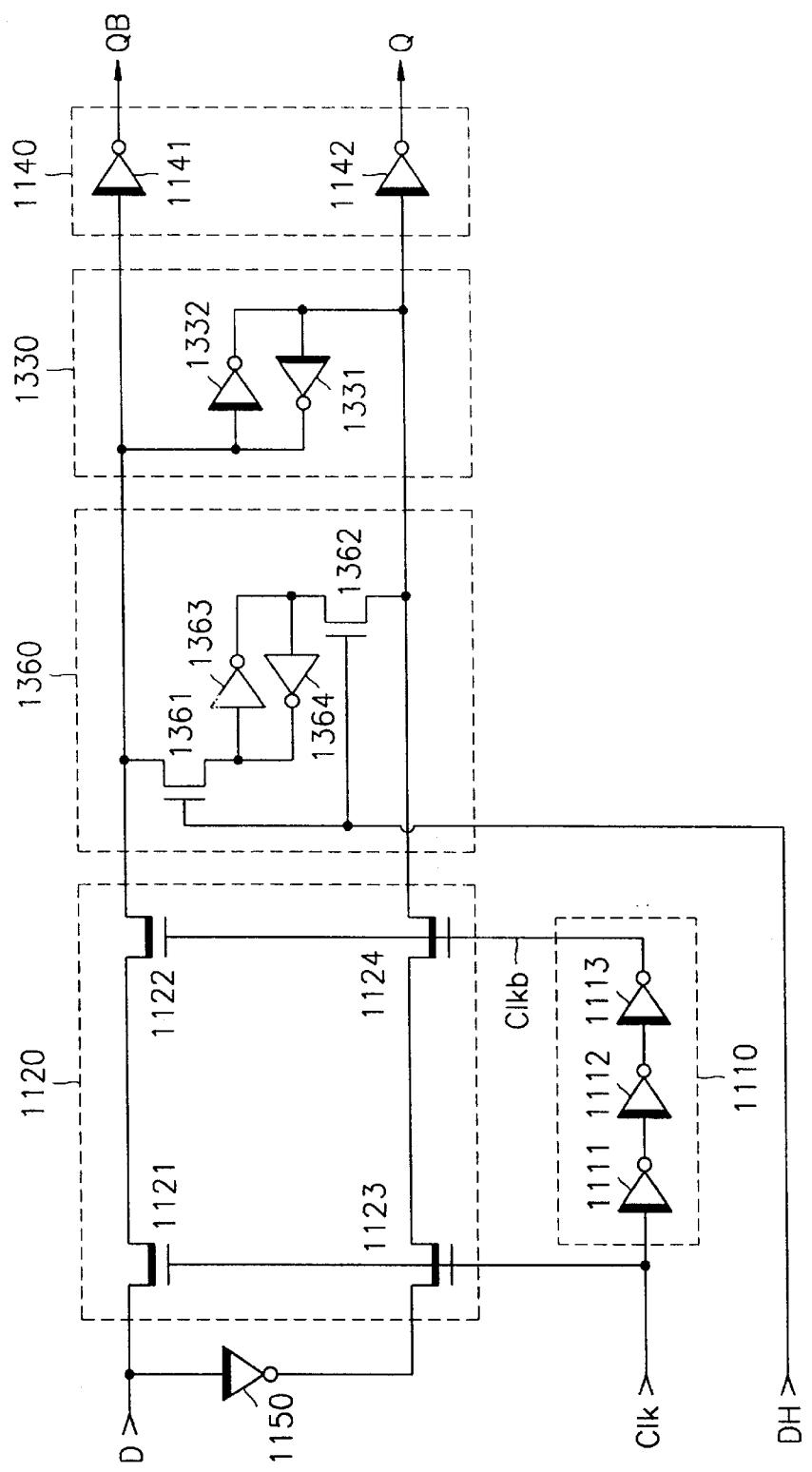
FIG. 13 is a circuit diagram of a ninth embodiment of the CP flip-flop according to the present invention.

FIG. 13 is a circuit diagram of a ninth embodiment of the CP flip-flop according to the present invention. Referring to FIG. 13, the CP flip-flop includes a clock delay unit 1110, a switch unit 1120, a latch unit 1330, a buffer unit 1140, a third inverter 1150, and a data holding unit 1360.

The CP flip-flop according to the ninth embodiment of the present invention differs from the seventh embodiment of the CP flip-flip in the latch unit 1330, and further includes the data holding unit 1360.

The latch unit 1330 includes a first inverter 1332 having an input port to which an output signal of the second switch 1122 is applied and an output port connected to an output port of the fourth switch 1124, and a second inverter 1331 having an input port to which an output signal of the fourth switch 1124 is applied and an output port connected to an output port of the second switch 1122. The first inverter 1332 and the second inverter 1331 include LT MOS transistors.

The data holding unit 1360 includes a first HT NMOS transistor 1361, a second HT NMOS transistor 1362, a fourth inverter 1363, and a fifth inverter 1364. The first HT NMOS transistor 1361 has one end connected to the output port of the second switch 1122 and a gate to which a data hold signal DH is applied. The second HT NMOS transistor 1362 has one end connected to the output port of the fourth switch 1124 and a gate to which the data hold signal DH is applied. The fourth inverter 1363 has an input port connected to the other end of the first HT NMOS transistor 1361 and an output port connected to the other end of the second HT NMOS transistor 1362. The fifth inverter 1364 has an input port connected to the output port of the fourth inverter 1363 and an output port connected to the input port of the fourth inverter 1363. The fourth inverter 1363 and the fifth inverter 1364 include HT MOS transistors.

Figure 14:
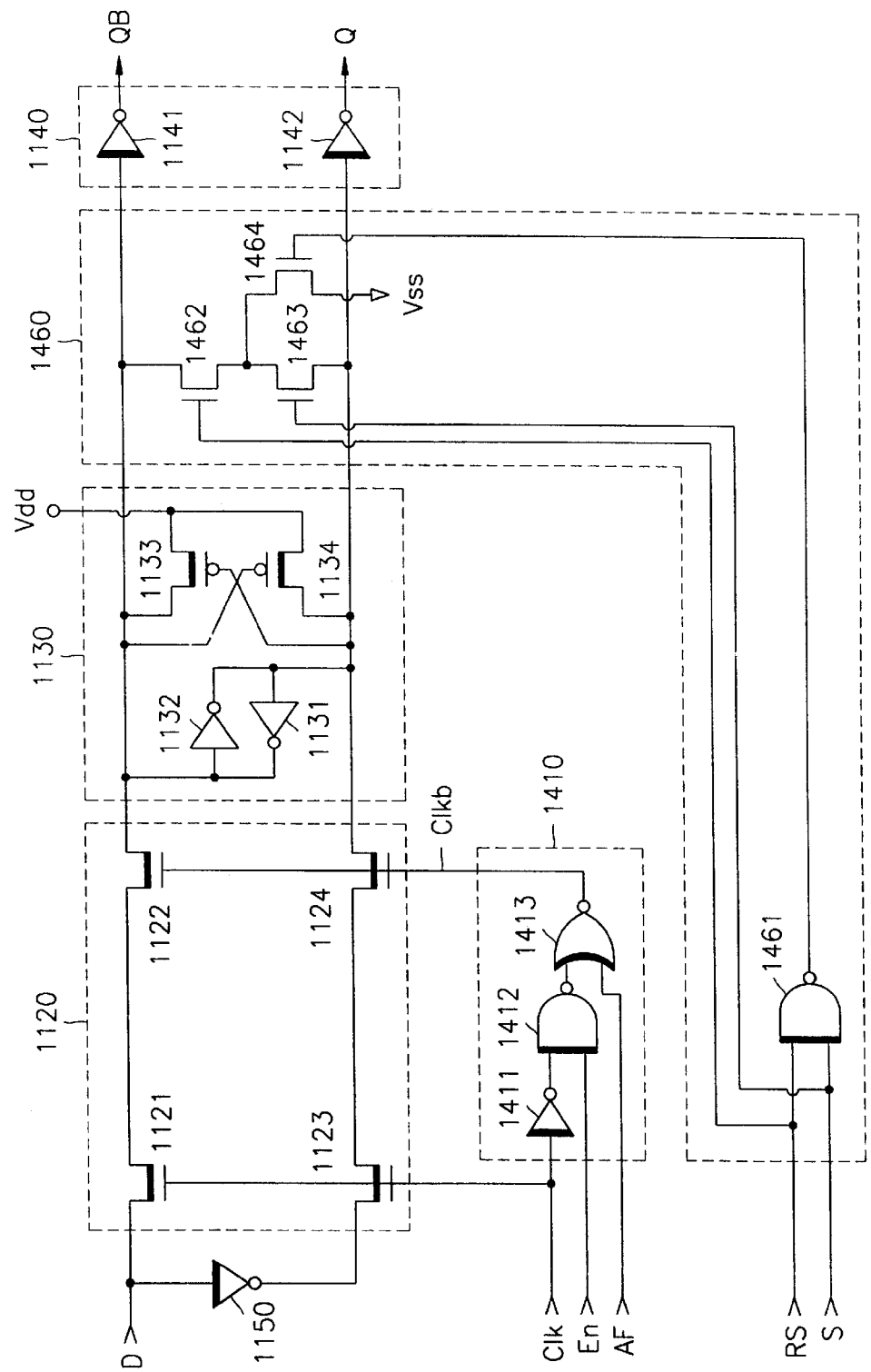
FIG. 14 is a circuit diagram of a tenth embodiment of the CP flip-flop according to the present invention.

FIG. 14 is a circuit diagram of a tenth embodiment of the CP flip-flop according to the present invention. Referring to FIG. 14, the CP flip-flop includes a clock delay unit 1410, a switch unit 1120, a latch unit 1130, a buffer unit 1140, a third inverter 1150, and a reset unit 1460.

The CP flip-flip of the tenth embodiment of the CP flip-flop according to the present invention differs from the seventh embodiment of the CP flip-flop in the clock delay unit 1410, and further includes a reset unit 1460. The clock delay unit 1410 includes a fourth inverter 1411 for inverting a clock signal Clk, a first NAND gate 1412 which responds to an output signal of the fourth inverter 1411 and an enable signal En, and a NOR gate 1413 which responds to an output signal of the first NAND gate 1412 and an anti-floating signal AF. The fourth inverter 1411 and the first NAND gate 1412 include LT MOS transistors, and the NOR gate 1413 includes LT MOS transistors and HT MOS transistors.

The reset unit 1460 includes a second NAND gate 1461 which responds to a set signal S and a reset signal RS, a first HT NMOS transistor 1462, a second HT NMOS transistor 1463, and a third HT MOS transistor 1464. The first HT NMOS transistor 1462 has one end connected to an output port of a second switch 1122 and a gate to which the reset signal RS is applied. The second HT NMOS transistor 1463 has one end connected to an output port of a fourth switch 1124, the other end connected to the other end of the first HT NMOS transistor 1462, and a gate to which the set signal S is applied. The third HT NMOS transistor 1464 has one end connected to the other end of the first HT NMOS transistor 1462, the other end connected to a second power supply voltage Vss, and a gate to which an output signal of the second NAND gate 1461 is applied. The second NAND gate 1461 includes LT MOS transistors.

Figure 15:
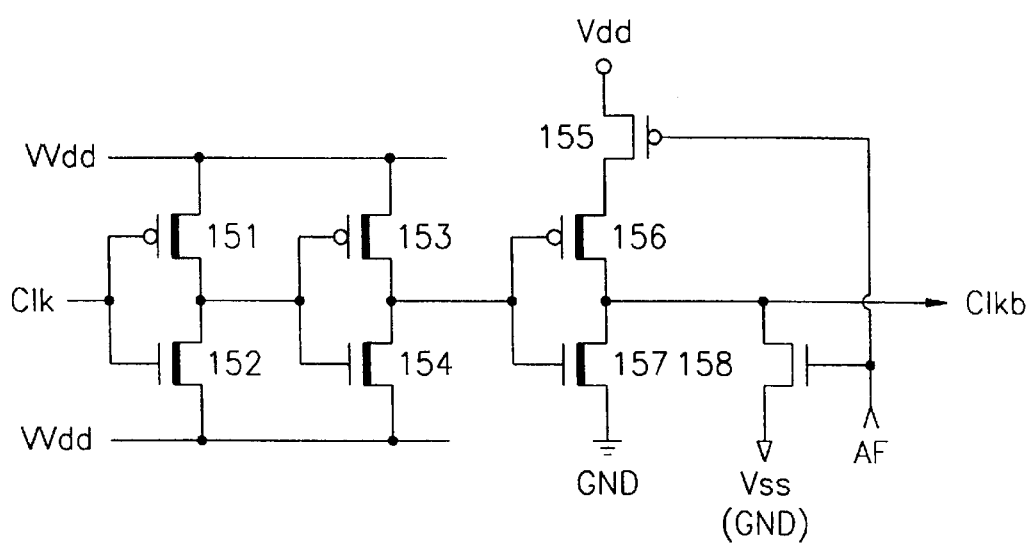
FIG. 15 is an internal circuit diagram of clock delay units of FIGS. 10 and 12.

FIG. 15 is an internal circuit diagram of the delay units of FIGS. 10 and 12. Referring to FIG. 15, a LT PMOS transistor 151 and an LT MOS transistor 152 form the inverters 1011 and 1211 for inverting a clock signal Clk. An LT PMOS transistor 153 and an LT NMOS transistor 154 form the inverters 1012 and 1212 for inverting an output signal of the fourth inverter. The NOR gates 1013 and 1213 include a first HT PMOS transistor 155, a first LT PMOS transistor 156, a second LT NMOS transistor 157, and a second HT NMOS transistor 158. The first HT PMOS transistor 155 has one end connected to a first power supply voltage Vdd and a gate to which an anti-floating signal AF is applied. The first LT PMOS transistor 156 has one end connected to the other end of the first HT PMOS transistor 155 and a gate to which an output signal of the inverters 153 and 154 is applied. The second LT NMOS transistor 157 has one end connected to the other end of the first PMOS transistor, the other end connected to a supply power voltage GND, and a gate to which the output signal of the fifth inverter is applied. The second HT NMOS transistor 158 has one end connected to the other end of the first PMOS transistor, the other end connected to a second power supply voltage Vss or GND, and a gate to which the anti-floating signal AF is applied. Inverted clock signal Clkb is generated at the node at which the other end of the first PMOS transistor and one end of the first NMOS transistor are connected.

The embodiments of the CP flip-flops according to the present invention illustrated in FIGS. 9 through 14 are designed for LSI applications using MTCMOS technology.

In the CP flip-flops according to the present invention, an additional circuit for retaining data latched in the sleep mode is not required. Also, LT MOS transistors are used as elements of the clock delay unit and the switch unit so that power consumption is minimized in the sleep mode as well as in the active mode.

Referring to FIG. 9, the mode selection signal MS remains at a logic high level in the active mode. In this case, it is preferable that two transistors used as the switches M1 and M2 are designed to have a large gate width-to-length ratio to minimize the "ON-resistance". This is for enabling the first virtual power supply voltage VVdd and the second virtual power supply voltage VVss or VGND generated from the first power supply voltage Vdd and the second power supply voltage Vss or GND via the switches M1 and M2, respectively, to act as power supply sources in a proper manner.

The mode selection signal MS remains at a logic low level in the sleep mode. In this case, the first virtual power supply voltage VVdd and the second virtual power supply voltage VVss or VGND is isolated from the first power supply voltage Vdd and the second power supply voltage Vss or GND that are actual power supply lines. However, the latch unit 930 is directly connected to the first power supply voltage Vdd and the second power supply voltage Vss or GND so that there is no problem in retaining data in the sleep mode.

The transistors of the switches M1 and M2 are turned off in response to the mode selection signal MS, and thus occurrence of sub-threshold leakage current in the sleep mode is suppressed in the CP flip-flop including LT MOS transistors. This is because a MOS transistor having a relatively high threshold voltage causes a considerably small sub-threshold leakage current compared to a MOS transistor having a relatively low threshold voltage. In addition, the CP flip-flop maintains the anti-flowing signal AF at a logic high level in the sleep mode so that the switches are kept closed, thereby surely preventing occurrence of leakage current by floating of the switches. Furthermore, when the power is turned off, flow of leakage current can be prevented by turning off the switches 1122 and 1124 of FIGS. 11 through 14 which are formed by NMOS transistors.

Figure 16:
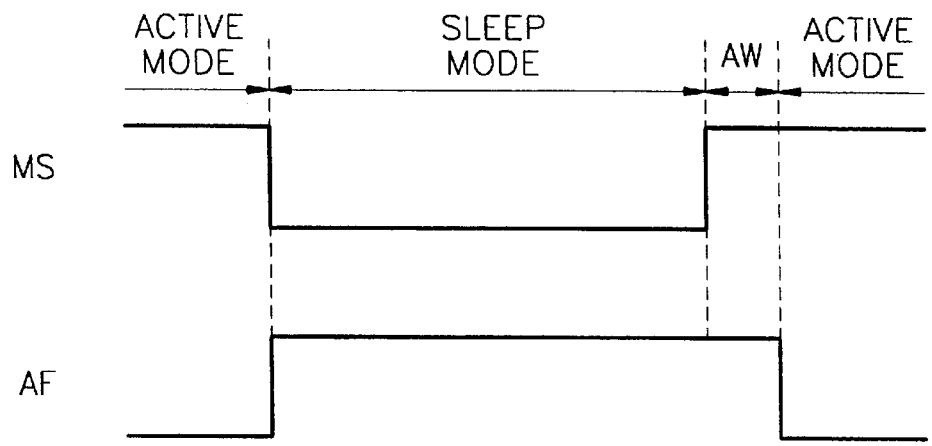
FIG. 16 shows the relation between a mode selection signal MS and an anti-floating signal AF for enabling the retention of latched data.

FIG. 16 shows the relation between the mode selection signal MS and the anti-floating signal AF. Referring to FIG. 16, after a transition of the mode selection signal MS from a sleep mode state to an active mode state, an active waiting (AW) period is followed before the anti-floating signal AF goes from high to low. If the transition of the mode selection signal MS from the sleep mode state to the active mode state occurs at the same time as the transition of the anti-floating signal AF, the switches are opened before the second virtual power supply voltage VGND is fully discharged by the mode selection signal MS, thereby causing data loss. For this reason, it is preferable that the floating signal AF goes to low after a slight delay AW from the transition of the mode selection signal MS, as shown in FIG. 16.

Figure 17:
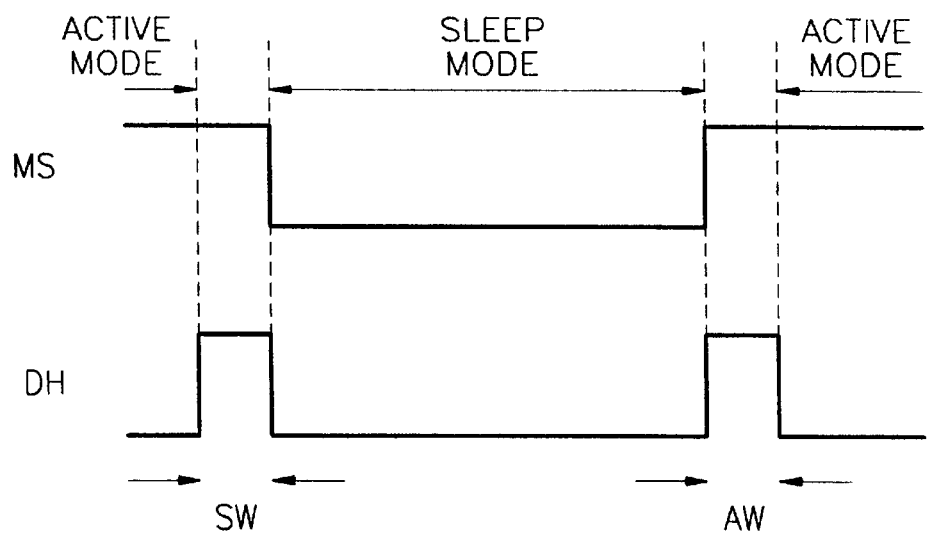
FIG. 17 shows the relation between the mode selection signal MS and a data hold signal DH.

FIG. 17 shows the relation between the mode selection signal MS and the data hold signal DH. Referring to FIG. 17, the data hold signal DH has a logic high level for a predetermined sleep waiting (SW) period before a transition of the mode selection signal MS from an active mode state to a sleep mode state and for a predetermined active waiting (AW) period after the transition of the mode selection signal MS. As shown in FIG. 17, the data hold signal DH is a signal for enabling the latch unit to read or write data when a transition between the active and sleep mode states is made.

The CP flip-flop according to the present invention is implemented with fewer transistors than conventional flip-flops, and is advantageous in that timing control of control signals required for operating the flip-flop can easily be designed.

Compared to conventional master-slave flip-flop circuits available for LSIs, the CP flip-flop according to the present invention can be applied to LSIs using MTCMOS technique, and does not need a special circuit used for retaining data stored in the sleep mode and complex designing of timing to operate the flip-flop. The CP flip-flop according to the present invention can be applied to any low-power consumption device, such as portable LSIs, digital signal processors (DSPs), or LSIs for microprocessors.

As described above, the CP flip-flop according to the present invention has a small layout area and can pass data at once to the output without being precharged, thereby implementing low-power and high-speed operation. When the CP flop-flop according to the present invention is applied to LSIs using MTCMOS technique, the CP flip-flop is operable in both active and sleep modes without an additional circuit for retaining latched data.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A complementary pass transistor based flip-flop comprising:

a first virtual power supply unit for providing a first virtual power supply voltage by receiving a first power supply voltage having a highest voltage level;

a second virtual power supply unit for providing a second virtual power supply voltage by receiving a second power supply voltage having a lowest voltage level;

a clock delay unit for receiving and outputting a clock signal by inverting and delaying the clock signal, and further receiving at least one control signal and outputting the clock signal by inverting and delaying the clock signal in response to the control signal;

a switch unit for switching input data in response to the clock signal and an output signal of the clock delay unit; and a latch unit for latching at least one output signal of the switch unit, wherein both the clock delay unit and the switch unit comprise low-threshold MOS transistors, the latch unit comprises a plurality of low-threshold MOS transistors or comprises a plurality of low-threshold MOS transistors and at least one high-threshold MOS transistor, the plurality of low-threshold MOS transistors each having a lower threshold voltage than the high-threshold MOS transistor and being operated between the first power supply voltage and the second power supply voltage, between the first power supply voltage and the second virtual power supply voltage, between the first virtual power supply voltage and the second power supply voltage, or between the first virtual power supply voltage and the second virtual power supply voltage, and the high-threshold MOS transistor being operated between the first power supply voltage and the second power supply voltage.

2. The complementary pass transistor based flip-flop of claim 1, further comprising an output buffer unit for externally transmitting an output signal of the latch unit.

3. The complementary pass transistor based flip-flop of claim 1, wherein the first virtual power supply unit comprises a first high-threshold MOS transistor having one end connected to the first power supply voltage, the other end connected to the first virtual power supply voltage, and a gate to which an inverted sleep mode signal, which is inverted from a sleep mode signal, is applied, and the second virtual power supply unit comprises a second high-threshold MOS transistor having one end connected to the second power supply voltage, the other end connected to the second virtual power supply voltage, and a gate to which the sleep mode signal is applied.

4. The complementary pass transistor based flip-flop of claim 1, wherein the clock delay unit comprises an odd number of inverters, which are connected in series, and inverts and delays the received clock signal.

5. The complementary pass transistor based flip-flop of claim 1, wherein the clock delay unit comprises an even number of inverters connected in series and a NOR gate having one input port connected to an output end of the last inverter and the other input port to which an externally input anti-floating control signal is applied.

6. The complementary pass transistor based flip-flop of claim 5, wherein the NOR gate comprises:
   a first high-threshold PMOS transistor having one end connected to the first power supply voltage and a gate to which the anti-floating control signal is applied;
   a first low-threshold PMOS transistor having one end connected to the other end of the first high-threshold PMOS transistor, the other end connected to an output port of the clock delay unit, and a gate to which an output signal of the last inverter of the even number of inverters is applied;
   a first low-threshold NMOS transistor having one end connected to the output port of the clock delay unit, the other end connected to the second power supply voltage, and a gate to which the output signal of the last inverter of the even number of inverters is applied; and
   a first high-threshold NMOS transistor having one end connected to the output port of the clock delay unit, the other end connected to the second power supply voltage, and a gate to which the anti-floating control signal is applied.

7. The complementary pass transistor based flip-flop of claim 1, wherein the switch unit comprises:
   a first switch including at least one low-threshold MOS transistor for switching the input data in response to the clock signal; and
   a second switch including at least one low-threshold MOS transistor for switching an output signal of the first switch in response to the output signal of the clock delay unit.

8. The complementary pass transistor based flip-flop of claim 7, wherein the complementary pass transistor based flip-flop further comprises a first inverter for inverting the input data, and the switch unit further comprises:
   a third switch including at least one low-threshold MOS transistor and being connected to an output of the first inverter for switching an output signal of the first inverter in response to the clock signal; and
   a fourth switch including at least one low-threshold MOS transistor and being connected to the output of the third switch for switching an output signal of the third switch in response to the output signal of the clock delay unit.

9. The complementary pass transistor based flip-flop of claim 7, wherein the latch unit comprises:
   a first inverter including high-threshold MOS transistors and having an input port connected to an output port of the second switch; and
   a second inverter including high-threshold MOS transistors and having an input port connected to an output port of the first inverter and an output port connected to the input port of the first inverter.

10. The complementary pass transistor based flip-flop of claim 9, wherein the latch unit further comprises a first low-threshold PMOS transistor having one end connected to the first supply power voltage, the other end connected to the input port of the first inverter, and a gate connected to the output port of the first inverter.

11. The complementary pass transistor based flip-flop of claim 10, wherein the latch unit further comprises a second low-threshold PMOS transistor having one end connected to the first supply power voltage, the other end connected to the input port of the second inverter, and a gate connected to the output port of the second inverter.

12. The complementary pass transistor based flip-flop of claim 8, wherein the latch unit comprises:
   a second inverter including high-threshold MOS transistors and having an input port connected to an output port of the second switch, and
   a third inverter including high-threshold MOS transistors and having an input port connected to an output port of the fourth switch and an output port of the second inverter and an output port connected to the output port of the second switch and the input port of the second inverter.

13. The complementary pass transistor based flip-flop of claim 12, wherein the latch unit further comprises a first low-threshold PMOS transistor having one end connected to the first power supply voltage, the other end connected to the input port of the second inverter, and a gate connected to the output port of the second inverter.

14. The complementary pass transistor based flip-flop of claim 13, wherein the latch unit further comprises a second low-threshold PMOS transistor having one end connected to the first power supply voltage, the other end connected to the input port of the third inverter, and a gate connected to the output port of the third inverter.

15. The complementary pass transistor based flip-flop of claim 14, wherein the latch unit is replaced with a data holding unit, and the data holding unit suppresses flow of leakage current from the switch unit to the latch unit in response to the data hold signal which is externally input.

16. The complementary pass transistor based flip-flop of claim 15, wherein the data holding unit comprises:
   a first high-threshold NMOS transistor having one end connected to an output port of the second switch and a gate to which the data hold signal is applied;
   a second high-threshold NMOS transistor having one end connected to an output port of the fourth switch and a gate to which the data hold signal is applied;
   a second inverter having an input port connected to the other end of the first high-threshold NMOS transistor and an output port connected to the other end of the second high-threshold NMOS transistor; and
   a third inverter having an input port connected to the other end of the second high-threshold NMOS transistor and an output port connected to the other end of the first high-threshold NMOS transistor.

17. The complementary pass transistor based flip-flop of claim 15, further comprising a set and reset unit connected to an output port of the data holding unit for setting or resetting an output signal of the complementary pass transistor based flip-flop.

18. The complementary pass transistor based flip-flop of claim 17, wherein the set and-reset unit comprises:
   a NAND gate for detecting whether either a set signal or a reset signal is generated by receiving the set signal through one input port and the reset signal through the other input port;
   a third high-threshold NMOS transistor having one end connected to one output port of the latch unit and a gate to which the rest signal is applied;
   a fourth high-threshold NMOS transistor having one end connected to the other output port of the latch unit, the other end connected to the other end of the third high-threshold NMOS transistor, a gate to which the set signal is applied; and
   a fifth high-threshold NMOS transistor having one end connected to the other end of the third high-threshold NMOS transistor and the other end of the fourth high-threshold MOS transistor, the other end connected to the second power supply voltage, and a gate connected to an output port of the NAND gate.

19. The complementary pass transistor based flip-flop of claim 8, further comprising a set and reset unit connected to an output port of the latch unit for setting or resetting an output signal of the complementary pass transistor based flip-flop.

20. The complementary pass transistor based flip-flop of claim 19, wherein the set and reset unit comprises:
   a NAND gate for detecting whether either a set signal or a reset signal is generated by receiving the set signal through one input port and the reset signal through the other input port;
   a third high-threshold NMOS transistor having one end connected to one output port of the latch unit and a gate to which the rest signal is applied;
   a fourth high-threshold NMOS transistor having one end connected to the other output port of the latch unit, the other end connected to the other end of the third high-threshold NMOS transistor, a gate to which the set signal is applied; and
   a fifth high-threshold NMOS transistor having one end connected to the other end of the third high-threshold NMOS transistor and the other end of the fourth high-threshold MOS transistor, the other end connected to the second power supply voltage, and a gate connected to an output port of the NAND gate.

21. The complementary pass transistor based flip-flop of claim 8, further comprising a data holding unit that responds an externally input data hold signal between the switch unit and the latch unit, for suppressing flow of leakage current from the switch unit to the latch unit.

22. The complementary pass transistor based flip-flop of claim 21, wherein the data holding unit comprises:
   a first high-threshold NMOS transistor having one end connected to an output port of the second switch and a gate to which the data hold signal is applied;
   a second high-threshold NMOS transistor having one end connected to an output port of the fourth switch and a gate to which the data hold signal is applied;
   a fourth inverter having an input port connected to the other end of the first high-threshold NMOS transistor and an output port connected to the other end of the second high-threshold NMOS transistor; and
   a fifth inverter having an input port connected to the other end of the second high-threshold NMOS transistor and an output port connected to the other end of the first high-threshold NMOS transistor.

23. The complementary pass transistor based flip-flop of claim 1, wherein the clock delay unit comprises:
   an inverter for inverting the clock signal;
   a NAND gate having one input port connected to an output port of the inverter and the other input port to which an enable control signal is applied; and
   a NOR gate having one input port connected to an output port of the NAND gate and the other input port to which an externally input anti-floating control signal is applied.

24. The complementary pass transistor based flip-flop of claim 23, wherein the NOR gate comprises:
   a first high-threshold PMOS transistor having one end connected to the first power supply voltage and a gate to which the anti-floating control signal is applied;
   a first low-threshold PMOS transistor having one end connected to the other end of the first high-threshold PMOS transistor, the other end connected to an output port of the clock delay unit, and a gate to which an output signal of the NAND gate is applied;
   a first low-threshold NMOS transistor having one end connected to the output port of the clock delay unit, the other end connected to the second power supply voltage, and a gate to which the output signal of the NAND gate is applied; and
   a first high-threshold NMOS transistor having one end connected to the output port of the clock delay unit, the other end connected to the second power supply voltage or a power supply voltage having a lower level than the second poser supply, and a gate to which the anti-floating control signal is applied.

25. The complementary pass transistor based flip-flop of claim 1, wherein each of the plurality of low-threshold MOS transistors has a threshold voltage of 0.1–0.4 volts for NMOS transistors and −0.1−−0.4 volts for PMOS transistors, and the high-threshold MOS transistor has a threshold voltage of 0.4–0.7 volts for NMOS transistors and −0.4−−0.7 volts for PMOS transistors.

26. The complementary pass transistor based flip-flop of claim 25, wherein each of the plurality of low-threshold MOS transistors has a threshold voltage of 0.33±0.04 volts for NMOS transistors and −0.4±0.04 volts for PMOS transistors, and the high-threshold MOS transistor has a threshold voltage of 0.6±0.06 volts for NMOS transistors and −0.65±0.06 volts for PMOS transistors.

* * * * *